US000001940H

(19) United States

(12) Statutory Invention Registration

Lohn, III

(10) Reg. No.: US H1940 H

(43) Published: Feb. 6, 2001

(54) SYSTEM AND METHOD FOR DYNAMICALLY MAPPING COMPONENTS WITHIN A TELECOMMUNICATIONS SWITCHING PLATFORM

(75) Inventor: H. John Lohn, III, Collierville, TN (US)

(73) Assignee: DSC/Celcore, Inc., Plano, TX (US)

(21) Appl. No.: 09/026,229

(22) Filed: Feb. 19, 1998

Related U.S. Application Data

(60) Provisional application No. 60/060,107, filed on Sep. 26, 1997.

(51) Int. Cl.[7] ..... G01R 31/08; G06F 11/00; G08C 15/00

(52) U.S. Cl. ..... 370/216

*Primary Examiner*—Daniel T. Pihulic

(74) *Attorney, Agent, or Firm*—John G. Flaim

(57) ABSTRACT

In a telecommunications system, components which fail and have backup resources are dynamically remapped to insert the backup resource in place of the failed component. A configuration database containing data for each resource in the switching platform of a telecommunications systems can be dynamically searched to identify backup resource and dynamically updated to reflect addressing and connection data for remapped components, thereby allowing dynamic replacement of failed components in the switching platform that is transparent to the applications processor of the telecommunications system.

5 Claims, 15 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

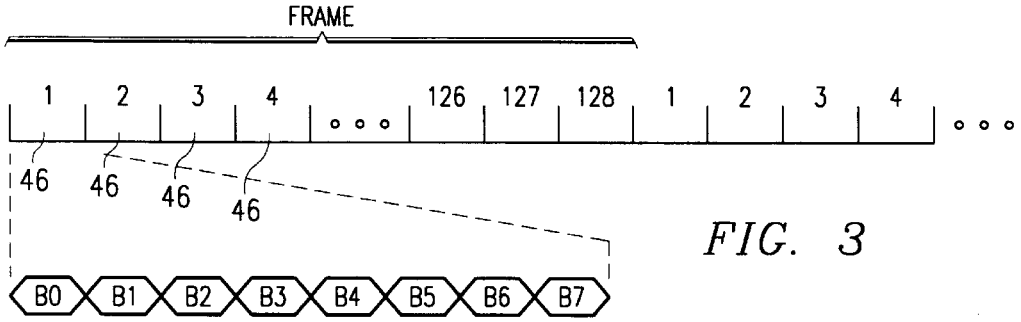
FIG. 3
FIG. 5
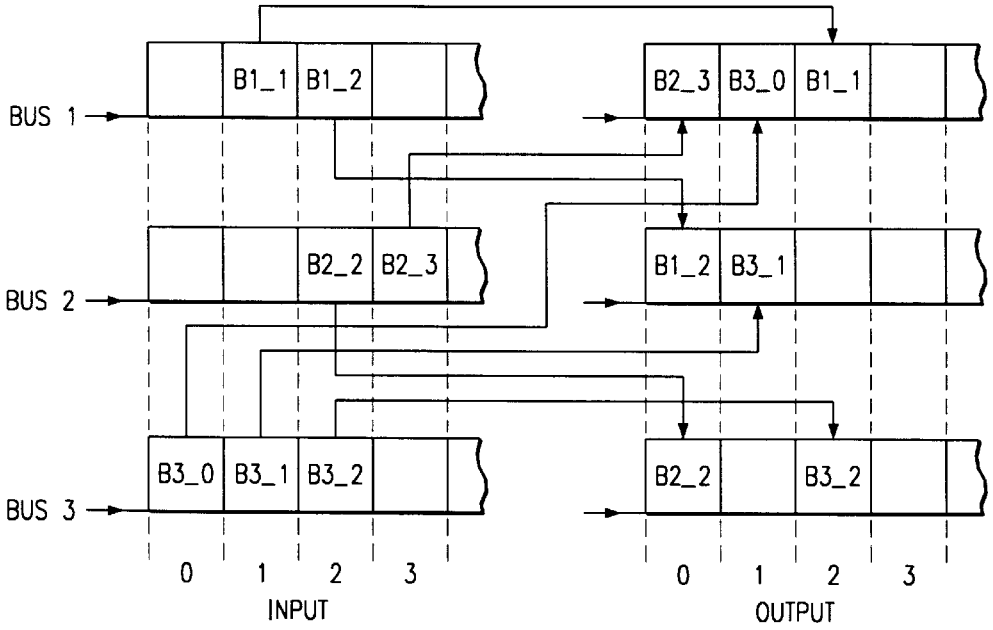

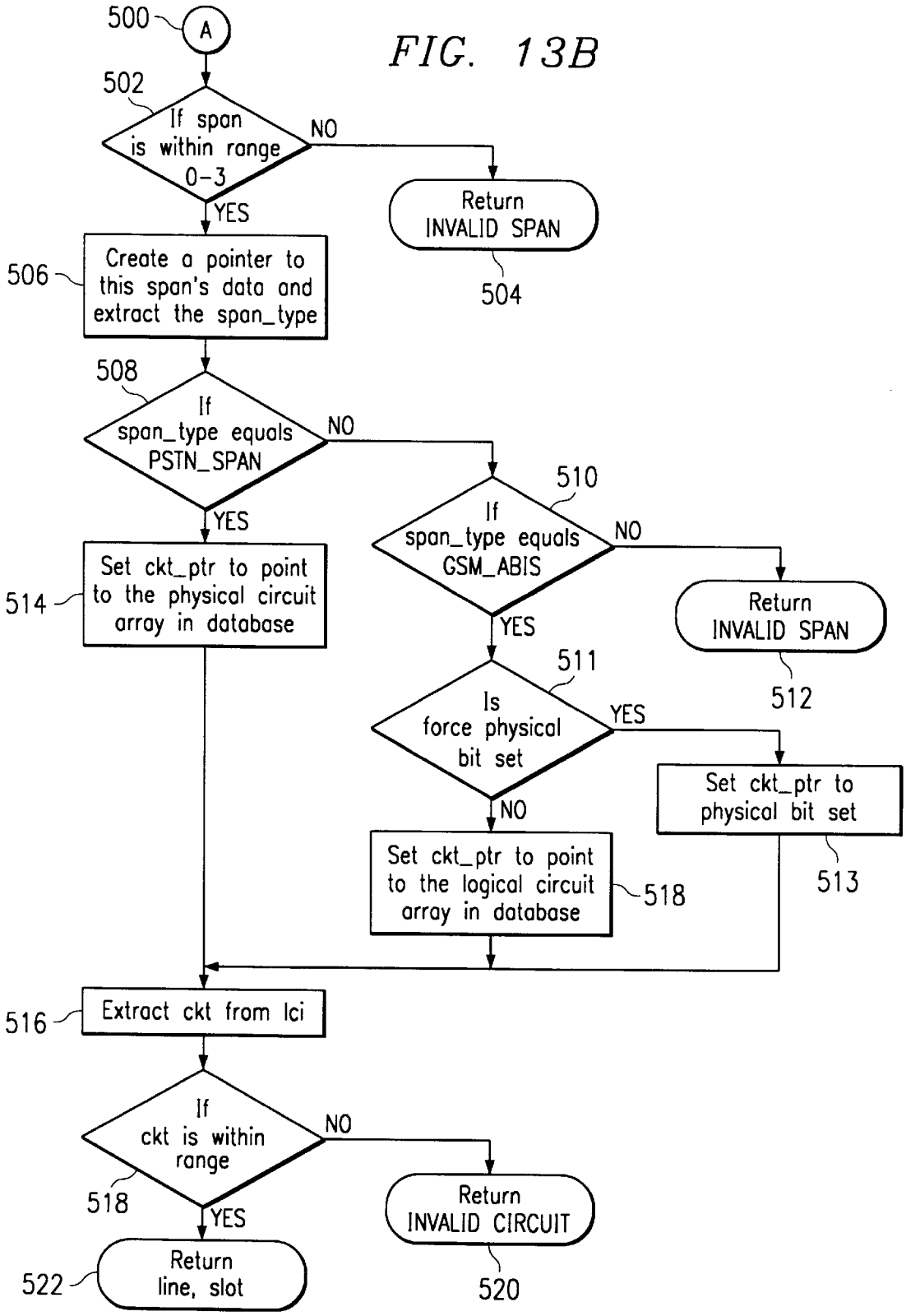
FIG. 13B
500
A
502
If span is within range 0-3
NO
YES
Return INVALID SPAN
504
506
Create a pointer to this span's data and extract the span_type
508
If span_type equals PSTN_SPAN
NO
YES
510
If span_type equals GSM_ABIS
NO
YES
Return INVALID SPAN
512
514
Set ckt_ptr to point to the physical circuit array in database
511
Is force physical bit set
YES
NO
Set ckt_ptr to physical bit set
513
Set ckt_ptr to point to the logical circuit array in database
518
516
Extract ckt from lci
If ckt is within range
NO
YES
518
Return INVALID CIRCUIT
520
522
Return line, slot

SYSTEM AND METHOD FOR DYNAMICALLY MAPPING COMPONENTS WITHIN A TELECOMMUNICATIONS SWITCHING PLATFORM

CLAIM OF PRIORITY

The instant patent application claims priority from the United States provisional patent application designated with Ser. No. 60/060,107, entitled Cellular Communication System, filed on Sep. 26, 1997.

RELATED PATENT APPLICATIONS

The instant patent application is related to the following patent applications: (a) U.S. patent application No. 09/026,467, Attorney Docket No. 24194000.185, entitled FAULT TESTING IN A TELECOMMUNICATIONS SYSTEM, filed concurrently with the instant application; (b) U.S. patent application No. 09/025740, Attorney Docket No. 24194000.191, entitled SWITCHING MODULE FOR A TELECOMMUNICATIONS SWITCHING PLATFORM, filed concurrently with this application; (c) U.S. patent application No. 09/026,485, Attorney Docket No. 24194000.192, entitled SPAN INTERFACE MODULE FOR A TELECOMMUNICATIONS SWITCHING PLATFORM, filed concurrently with this application; (c) U.S. patent application No. 09/026,488, Attorney Docket No. 24194000.193, entitled SIGNAL-PROCESSING MODULE FOR A TELECOMMUNICATIONS SWITCHING PLATFORM, filed concurrently with this application; (e) U.S. patent application No. 09/026,321, Attorney Docket No. 24194000.194, entitled TELEPHONY-SUPPORT MODULE FOR A TELECOMMUNICATIONS SWITCHING PLATFORM, filed concurrently with this application; and (f) U.S. patent application No. 09/026,486, Attorney Docket. No. 24194000.196, entitled SYSTEM AND METHOD FOR FORMING CIRCUIT CONNECTIONS WITHIN A TELECOMMUNICATIONS SWITCHING PLATFORM, filed concurrently with this application.

FIELD OF THE INVENTION

The present invention relates to telecommunications systems and more particularly to the dynamic mapping of components in a telecommunications switching platform.

BACKGROUND INFORMATION

Telecommunications switching platforms operate to connect incoming communication channels to selected outgoing communication channels. This switching is generally done in response to phone numbers dialed by the users or subscribers of the company operating the telecommunications system, or by others who are calling these subscribers. For example, the caller enters a phone number and signaling is sent along with or over the communication channel and the telecommunication system attempts to establish an end-to-end communications link to the destination number that the caller has dialed.

An end-to-end communications channel is established through a switch within the telecommunications switching platform. This switch is typically a non-blocking matrix switch, which is operable to connect the incoming channel to one of many outgoing channels. The switch operates under control of a processor within the telecommunications switching platform. The processor supplies information that the switch uses to connect one information channel to another through the switch. Typically, the switch receives a number of time-multiplexed input signals and provides a number of time-multiplexed output signals. There are also typically a number of resources within the switching platform. These resources may be connected to each other or to an information channel through the switch. For example, if the caller seeks to initiate a call to a busy number, the caller must receive a busy signal; this busy signal is provided by a resource within the telecommunications switching platform, and the familiar busy tone is passed through the switch and received by the caller.

In conventional telecommunications systems, the applications processor (e.g., the call processor) keeps track of the addresses assigned to the various incoming and outgoing communications channels, as well as the various resources that are addressed within the telecommunications switching platform. This is done through hard wiring or a large table of fixed addresses corresponding to these communication channels and resources. Thus, for example, traffic channels are processed through an assigned digital signal processor (DSP) and if the DSP fails, the associated traffic channels are not available until the DSP is repaired or replaced due to the inability of the telecommunications to dynamically reallocate DSPs to traffic channels.

SUMMARY OF THE INVENTION

According to an embodiment of the present invention, failed components, such as DSPs, are identified and available components are identified and dynamically mapped to traffic channels to optimize the availability of traffic channels and resources. Logical component identifiers for resources and information channels of the platform are used to allow dynamic addressing of components and provide significant flexibility over prior art systems. A database of configuration data for resources in the switching platform is built at initialization of the telecommunications system, including the construction of logical components identifiers for the resources in the switching platform that can be used as indices to the database, allowing for the dynamic remapping of resources by dynamically updating the configuration database..

BRIEF DESCRIPTION OF THE DRAWINGS

FIG. 3 is a timing diagram illustrating the multiplexing of telecommunications channels upon the high-speed buses of FIG. 2;

FIG. 5 is timing diagram for several high-speed buses, illustrating the switching task performed by the switching module of the telecommunications switching platform.

FIGS. 13A–13D illustrate an exemplary flow diagram of the steps taken in translating and interpreting logical identifiers according to an embodiment of the present invention.

DETAILED DESCRIPTION OF THE INVENTION

Figure 1:
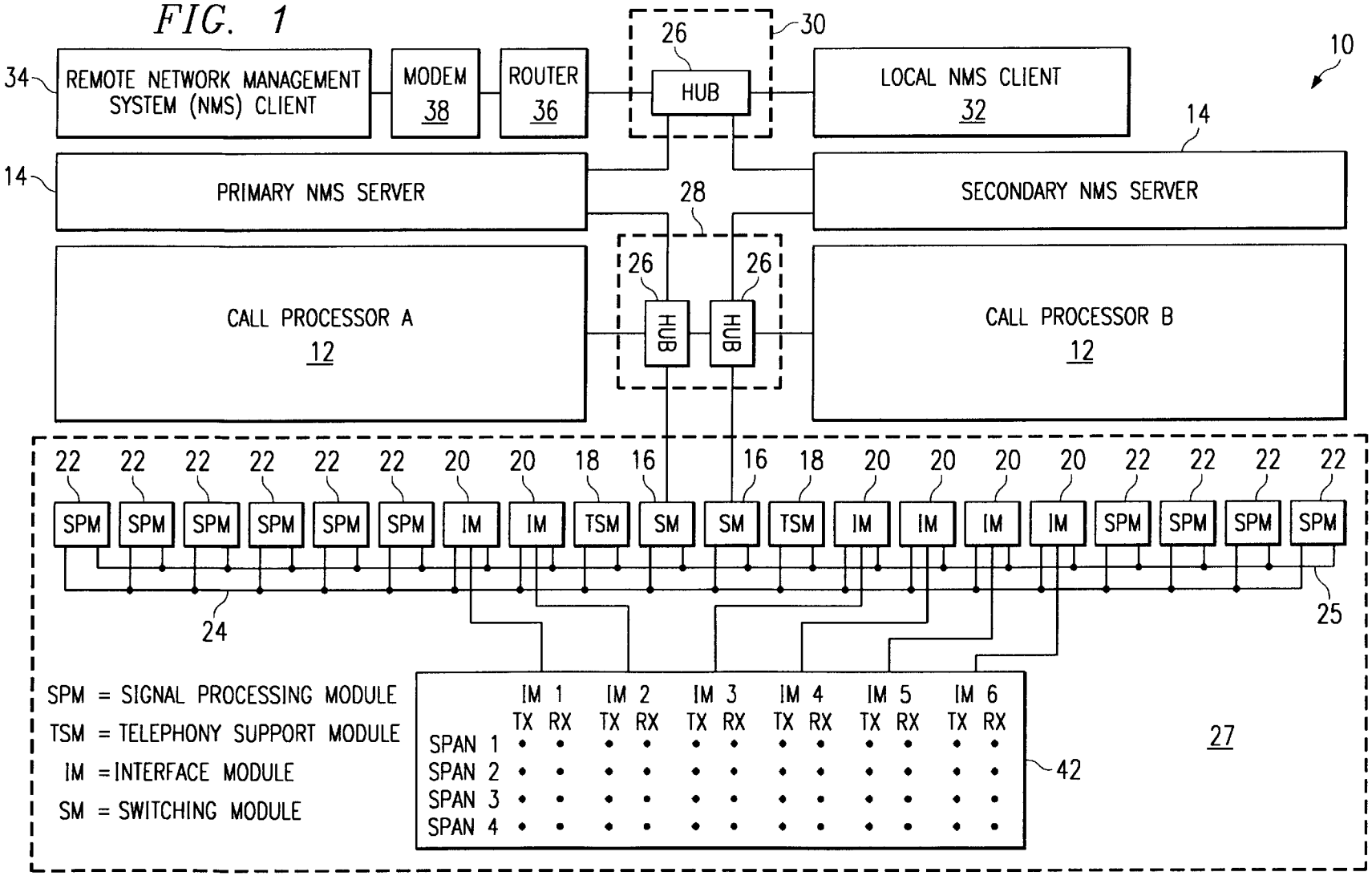
FIG. 1 is a block diagram of an embodiment of the claimed telecommunications switching platform.

FIG. 1 is a block diagram of an embodiment of the present invention. This block shows the overall telecommunications switching platform 10. This switching platform 10 includes redundant call processors 12 and Network Management System ("NMS") servers 14 as well as switching modules 16 and resource processors 18, 20, 22 that carry out a number of the lower-level tasks to be accomplished by the switching platform 10. Resource processors include, for example, a telephony support module 18, an interface module 20, and a signal-processing module 22. The resource processors are described below, and are described in further detail in U.S. patent application Nos.: 09/025,740 (Docket No. 24194000.191), entitled "Switching Module for a Telecommunications Switching Platform"; 09/026,485 (Docket No. 24194000.192), entitled "Span Interface Module for a Telecommunications Switching Platform"; 09/026,488 (Docket No. 24194000.193), entitled "Signal-Processing Module for a Telecommunications Switching Platform"; and 09/026,321 (Docket No. 24194000.194), entitled "Telephony-Support Module for a Telecommunications Switching Platform," all of which were filed on Feb. 19, 1998 and are hereby incorporated by reference.

The switching modules 16 and resource processors 18, 20, 22 communicate with each other through, for example, a control bus 24. Data is passed between these same elements over high-speed data buses 25, which are preferably time-multiplexed serial data buses. The operation of these high-speed data buses 25 will be described in greater deal in FIGS. 2–3 and the text accompanying these figures.

Still referring to FIG. 1, the switching modules 16 preferably communicate with higher-level functional elements (the call processors 12, for example) within the platform 10 through communication hubs 26. In an embodiment of the present invention, logical communication paths are made between the resource processors 18, 20, 22 and the higher-level functional elements via the switching module 16 through, for example, TCP/IP sockets through the communication hubs 26. The higher-level functional elements are described in greater detail in U.S. patent application No. 60/060,107, entitled "Cellular Communication System," naming Anthony G. Fletcher and Scott D. Hoffpauir as inventors, and which was filed on Sep. 26, 1997, which is hereby incorporated by reference herein.

The communication hubs 26 connect the call processors 12 to the switching modules 16 and the NMS servers 14. Preferably, there are two distinct LANs 28, 30 within the call processor 12. The first LAN 28 connects the redundant call processors 12 to the redundant NMS servers 14 and redundant switching modules 16 through redundant communication hubs 26. The second LAN 30 can connect the redundant NMS servers 14 to local NMS clients 32 and/or remote NMS clients 34. Connection to remote NMS clients 34 is preferably performed through a router 36 and a modem 38. Since there is no direct NMS client access to the first LAN 28 on which the call processors 12, the switching modules 16, or the resource processors 18, 20, 22 operate, the NMS servers 14 may serve as "firewalls" against hacker intrusion into the switching platform 10.

With further reference to FIG. 1, the interface modules 20 connect externally to telecommunication spans 40 (see FIG. 2), which are, for example, industry-standard T1or E1 spans each carrying a number of information channels as specified by the particular standard. These information channels may be traffic channels or control channels, as will be discussed below. Connection to the spans are made through span signal paths 41 from the interface modules to a span connector panel 42, which is the point at which the telecommunication spans 40 (see FIG. 2) physically connect to the switching platform 10.

Collectively, the switching modules 16, resource processors 18, 20, 22, control buses 24, high-speed buses 25, span signal paths 41, and span connector panel 42 are referred to as the Input/Output Sub-System ("IOSS") platform 27. In one embodiment of the present invention, the IOSS platform 27 resides on a single shelf within a telecommunications equipment rack and performs the lower-level functions within the telecommunications switching platform 10.

Control bus 24 preferably comprises a pair of redundant control buses 24, over which the various resource processors 18, 20, 22 communicate using, for example, a Local COMmunication (LCOM) protocol. Although the high-speed data buses 25 are sometimes referred to as PCM buses, where PCM stands for Pulse Code Modulation, which is a digital voice encoding standard, the data carried on them may include control information, signaling information, data information, and voice information encoded using other standards. For example, voice information that has been encoded by a Global Standard for Mobile Communication (GSM) system are encoded using a certain type of Linear Predictive Coding (LPC).

Communication hubs 26 are preferably Ethernet Local Area Network (LAN) communication hubs, although the hubs 26 may be hubs for other local networking protocols such as, for example, Token Ring or StarLAN. The communication hubs 26 and protocols may operate using either wired or wireless connection schemes. Although the resource processors 18, 20, 22 preferably communicate with higher-level functional elements in the system through the switching module 16 via Transmission Control Protocol/Internet Protocol ("TCP/IP") sockets through the communication hubs 26, other networking protocols are possible. It is also possible, for example, to have such resource processors 18, 20, 22 directly connected to the higher-level elements in the system such that they will be directly addressed by these high-level elements using data and address buses.

"Lower-level" functions, which are described above as being performed by the IOSS platform 27 might be defined, for instance, as all functions within the Open System Interconnection ("OSI") framework as being below the Session Layer (Layer 4). Under such a division, the IOSS platform 27 would be responsible for communications routing and end-to-end delivery of information, including error recovery and flow control.

Figure 2:
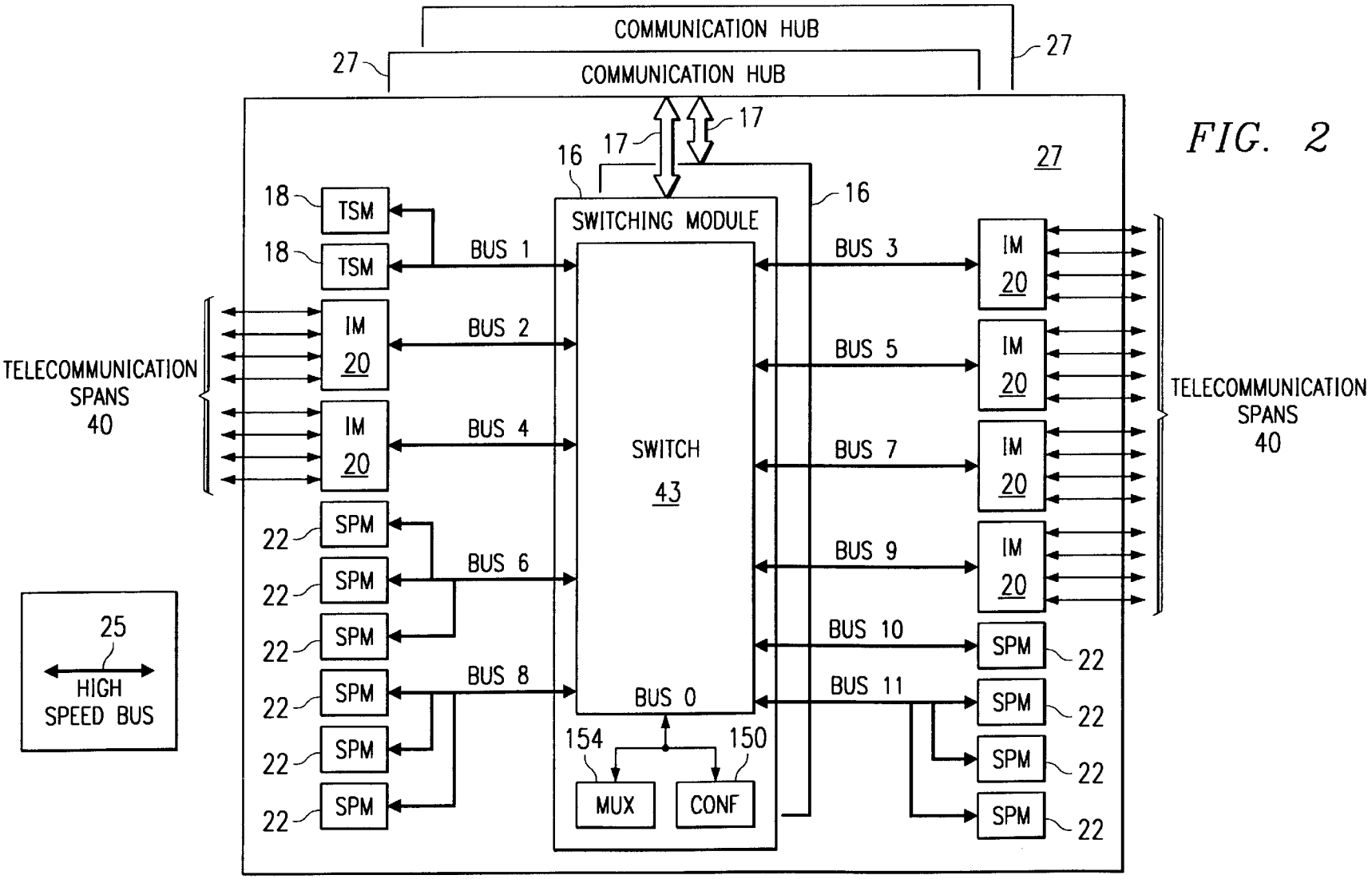
FIG. 2 is a block diagram of lower-level functional elements within the telecommunications switching platform of FIG. 1.

FIG. 2 is a block diagram of lower-level functional elements within a telecommunications switching platform 10. At the center of this block diagram are the redundant switching modules 16, which are connected to the higher-level functional elements in the platform 10 through the communication hubs 26. Communications between the higher-level functionality and the resource processors 18, 20, 22 are routed through, for example, the active, or ONLINE, switching module 16 instead of the inactive or OFFLINE one of the redundant switching modules 16.

The switching module 16 performs a number of functions. For example, one function of the switching module 16 is switching the telecommunication information channels arriving into the platform 10 through the telecommunications spans 40. As shown in FIG. 2, telecommunication spans 40 are connected to the interface modules 20. Information channels are transmitted within the spans 40 through, for example, time division multiplexing. The switching module 16 contains switches 43, which are responsible for making the connections between information channel inputs and information channel outputs according to commands from the higher-level functionality within the platform such as the call processor 12. The software function within the call processor 12 that controls switching of the information channels at the applications layer may be called the Resource Manager. These higher-level functions and systems are described in greater detail in U.S. patent application No. 09/026,485 (Docket No. 24194000.192), which is incorporated by reference herein.

The switching platform 10 is also operable to, for example, receive from and transmit to GSM-standard mobile phones. Under the GSM standard, wireless voice channels are transmitted at 16 kbps ("kbps"), using LPC coding, whereas under many land-based telephony standards voice channels are transmitted at 64 kbps using PCM coding. Thus, in order to connect a mobile caller to a land-based called party, it is necessary to adapt the rate of the 16 kbps GSM voice channel to the land-based 64 kbps standard. This rate conversion is accomplished by, for example, a signal processing module 22.

With continued reference to FIG. 2, a GSM Base Transceiver Station (BTS) 44 (see FIG. 4) transmits four GSM voice channels on a 64 kbps DSO information channel. The telecommunications switching platform 10 connects the 64 kbps DSO channel from the BTS 44 to a signal processing module 22 so that the signal-processing module 22 can convert this DSO information channel into four discrete 64 kbps PCM-encoded channels. These four 64 kbps information channels are then switched to four different information channels. The final switching of four channels to four different channels will accomplish the end-to-end switching or will connect one or more of the GSM voice channels to one of the telephony support functions (such as dial tones or DTMF signaling).

Since voice connections are bi-directional or full-duplex, the connection process described above is carried out in the reverse order to receive signals from the land-based information channels. Thus, the switching module 16 connects one 64 kbps DSO channel to the signal processing module 22, then connects the four 64 kbps channels outputs from the signal processing module 22 to four different 64 kbps information channels, and these connections are duplicated in the reverse direction, for a total of 10 switch connections.

Still referring to FIG. 2, connection is made between the information channels and the resource processors 18, 20, 22 and the switching modules 16 through a series of high-speed buses 25. As shown in FIG. 2, there are a total of 12 such buses used in this embodiment. For future capacity expansion, spare high-speed buses 25 may be included within the telecommunications rack and switch 43 may be configured to switch information channels on these additional buses. For example, four such spares can be provided for a total of 16 high-speed buses. Each of these buses 25, which are operational at an exemplary data rate of 8.192 megabits per second ("Mbps"), gives each bus 25 a capacity for 4 E1 spans, each E1 span having a data rate of 2.048 Mbps. Each of these buses 25 is logically subdivided into 128 timeslots 46 (see FIG. 3). Each of these 128 timeslots 46 may be, for example, a 64 kbps channel. To share each of these buses between the various resources within the telecommunications switching platform 10, each resource or incoming information channel is assigned a certain position or timeslot within the buses 25 to which they are attached.

The switching module 16 uses a switch 43 to make connections between a timeslot 46 on one bus 25 to a different timeslot 40 on that same bus 25 or another bus 25. In an embodiment of the present invention, the switching module 16 is capable of connecting any of 2048 inputs to 2048 outputs. All of these connections can preferably be maintained simultaneously. The resources used within the switching platform 10 may be dynamically assigned based on system needs. As mentioned, the interface modules 20 form the entry and exit points for telecommunications spans 40 that are connected to the switching platform 10. Each of these interface modules 20 is capable of handling, for example, four El spans 40. Each El span may be comprised of 32 channels including 30 voice channels transmitted at 64 kbps, one 64 kbps framing channel and one 64 kbps signaling channel. There are a total of six interface modules 20 shown in FIG. 2, each of which is preferably capable of handling four spans 40. The switch 43 is preferably a Time-Space-Time switch, which is a space switch (i.e., a matrix switch) interposed between two time switches.

Figure 8:
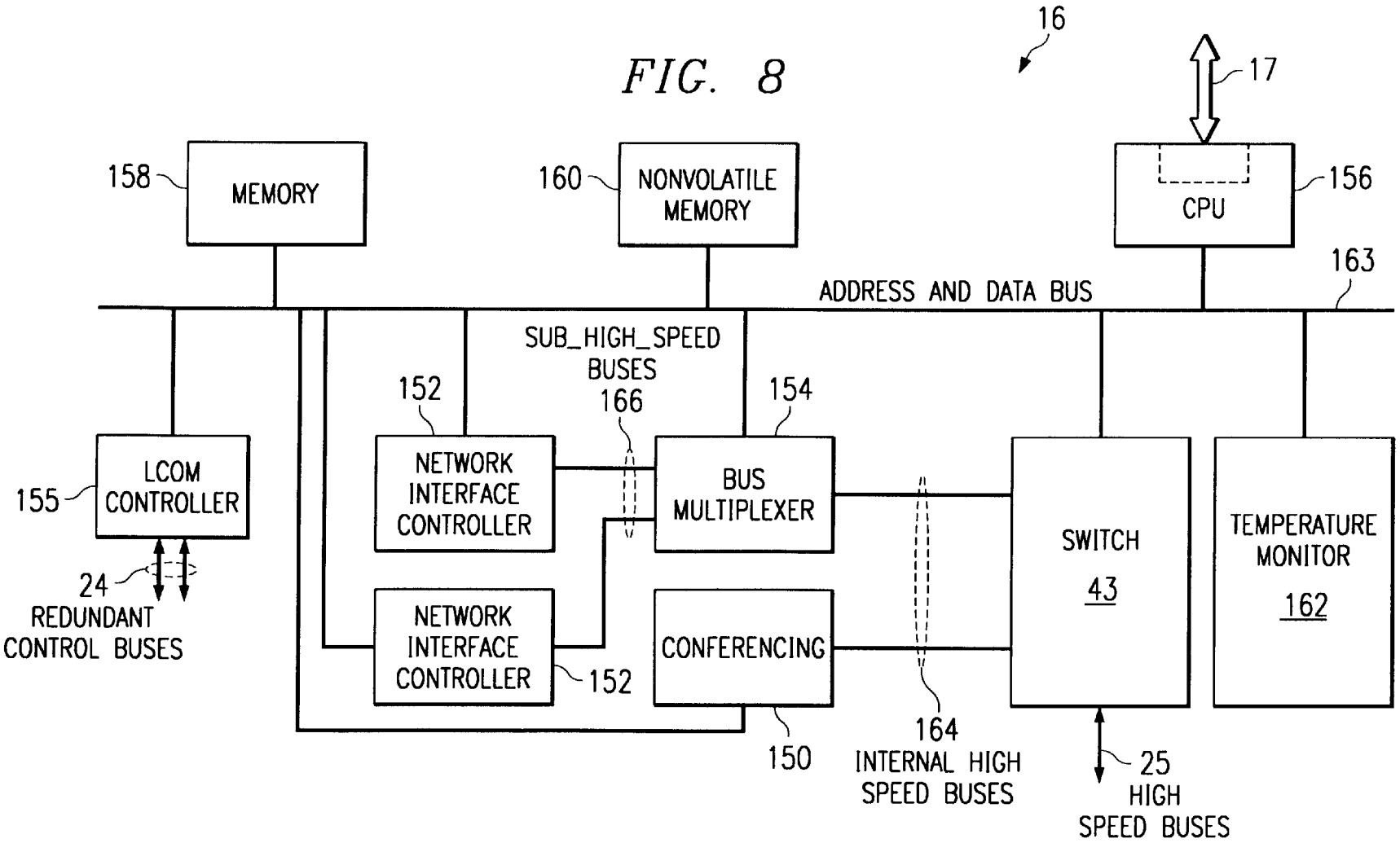
FIG. 8 is a block diagram of the switching module of FIGS. 1–2.

FIG. 8 provides an exemplary block diagram of the switching module 16. In this embodiment, the switching module 16 provides functions such as, for example, switching (SWTH task 70, see FIG. 6); conferencing; data communication; local communications (LCOM task 74, see FIG. 6); remote LAP-D communications (RLPD task 66, see FIG. 6); and an Ethernet interface.

FIG. 8 shows the switching module 16 from a hardware perspective. The switch 43 in this embodiment is, for example, a 2048 by 2048 memory timeslot, non-blocking switch implementation. The switch 43 may be, for instance, a Time-slot Interchange Random Access Memory (TSIRAM). The switch 43 operates to receive and transmit over a number of high-speed buses 25, making timeslot cross connections from one timeslot of one high-speed bus 25 to a different timeslot within the same high-speed bus 25 or another high-speed bus 25, as was discussed with respect to FIG. 3. It is possible to accomplish this function using, for example, four SIEMENS Memory Time Switch Large (MTSL-16) components, although other components may provide the same function. All timeslot cross connections preferably take place within this switch 43. This will provide capacity for sixteen high-speed buses 25 (e.g., 8.192 Mbps buses) to interconnect modules on the backplane along internal components of the switching module 16. Each 8.192 Mbps bus 25 provides one hundred and twenty-eight 64 kbps timeslots.

Still referring to FIG. 8, the Local Communications Function 74 preferably comprises a point-to-multipoint control bus link 24 between the switching module 16 and the resource processors 18, 20, 22. This function is preferably provided by controller 155, which may, for example, be a SIEMENS Enhanced Serial Communications Controller (ESCC2), although other components are commercially available to serve this local communication function. A second link 24 is provided for redundancy. This bus 24 provides part of the communication path between the applications processor 12 and modules local to the backplane 16, 18, 20, 22. The switching module 16 completes the path to the applications processor through local communication network 28. The switching module uses this same network 28 for its communication path to the application processor 12. The local communication (LCOM) software task 74 is represented on FIG. 6, and is executed on the switching module 16.

The network 28 is preferably an Ethernet LAN, connected through a 10BaseT connector on the front of the switching module 16 which is implemented, for example, using a MOTOROLA Enhanced Ethernet Transceiver (EET) and an Ethernet controller that is integrated into the switching module controller 156. The controller 156 additionally provides supervisory control of all the tasks that execute on the switching module 16. Additionally provided, either integrated within the controller 156 or as components connected thereto (as shown in FIG. 8), are a memory 158 and a nonvolatile memory 160. The memory 158 preferably stores run-time code and data, and is preferably a Dynamic Random Access Memory (DRAM) having a capacity of at least 4 Megabytes. The nonvolatile memory 160 preferably stores a non-volatile backup copy of the run-time memory and is preferably a FLASH memory having at least 2 Megabytes storage. The nonvolatile memory 160 may contain hardware write-protected blocks of code for boot up. The runtime code can be downloaded and upgraded remotely, whereas preferably the boot code can be upgraded only after on-site removal of the hardware boot_block_protection feature. This protection is implemented in this way to protect the reliability of operation of the switching 16 module in the event of power failure during runtime code updates. A temperature monitor 162 may be provided to alarm upon ambient temperature thresholds being exceeded.

With further reference to FIG. 8, the switching module 16 contains previously-described external connections, which are the redundant control buses 24, the high-speed buses 25, and the network connection 17. The switching module 16 also contains an internal address and data bus 162, through which the switching module controller 156 can access the memories 158, 160 that are internal to the switching module 16. The switching module 16 also contains two internal high-speed buses 164, which may, for instance, be used to implement conferencing and LAPD functionality through communications with the conferencing unit 150 and the bus multiplexer 154. The bus multiplexer 154 may in turn be connected to the network interface controllers 152 through high-speed buses 166. These high-speed buses 166 are preferably high-speed serial LAP-D buses, although these buses may also be implemented with a lower data rate than is used in the other high speed data bases 25, 164.

Figure 9:
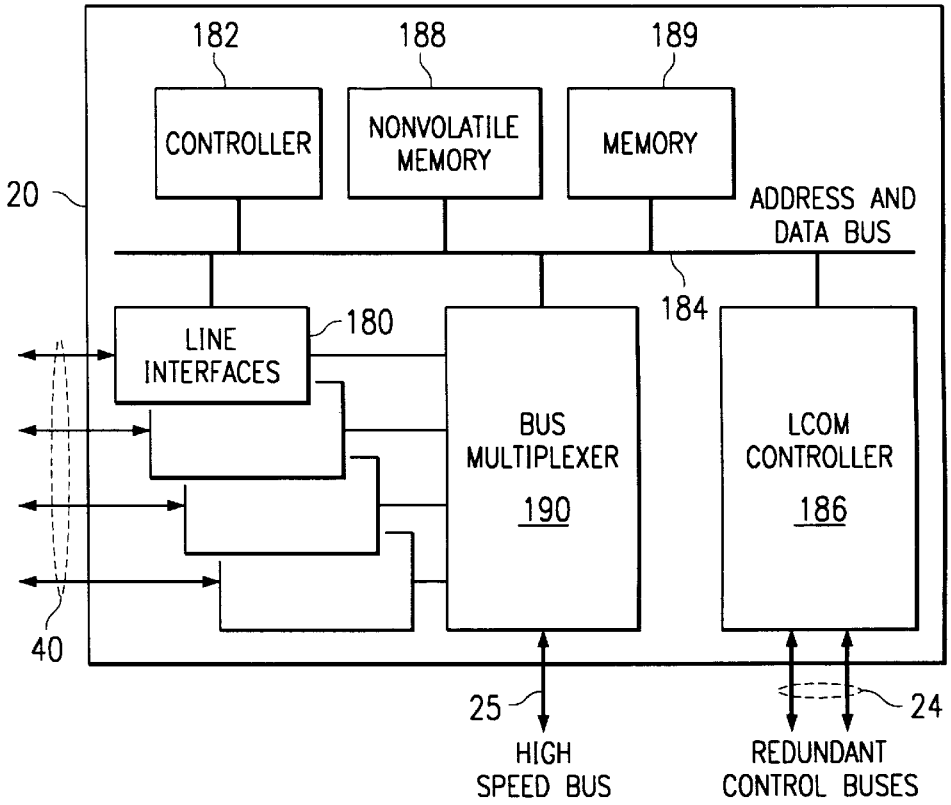
FIG. 9 is a block diagram of the interface module of FIGS. 1–2.

A block diagram of exemplary interface module 20 is provided in FIG. 9. The interface module 20 is the point at which the telecommunications spans 40 enter the switching platform 10. These connections are shown where the four spans 40 enter the interface module 20 and are connected to four line interface circuits 180. Depending on the ability to integrate the functions of the line interface circuit 180, these functions could be implemented in a single integrated component or in a greater number of components. Also, although interface module 20 is shown having four span connections, more or less spans 40 could be handled by a single module 20, depending on the state of the technology used and the complexity of the functions provided in a particular module.

With further reference to FIG. 9, a span interface controller 182 provides control of the interface module 20. The span interface controller 182 communicates with other components within the interface module 20 through span interface address and data bus 184. The interface module 20 communicates with other components in the IOSS platform 27, particularly with the switching module 16, through the redundant control buses 24. The controller 186 is provided to implement the communications protocol by which this communication is carried out. Associated with the controller 186 is a nonvolatile memory 188 in which this interface module 20 can maintain its operating code in a nonvolatile fashion. Preferably, this nonvolatile memory 188 is a FLASH memory, whereby although the code is stored a nonvolatile fashion, it can still be changed with minimal effort. Another memory 189, a DRAM for example, is also provided for storage of the controller's 182 real-time executable code and data. A bus multiplexer 190 is provided so that in this embodiment the four telecommunications spans 40 can be multiplexed into a single high-speed bus 25 and transmitted to the switching module 16.

Figure 10:
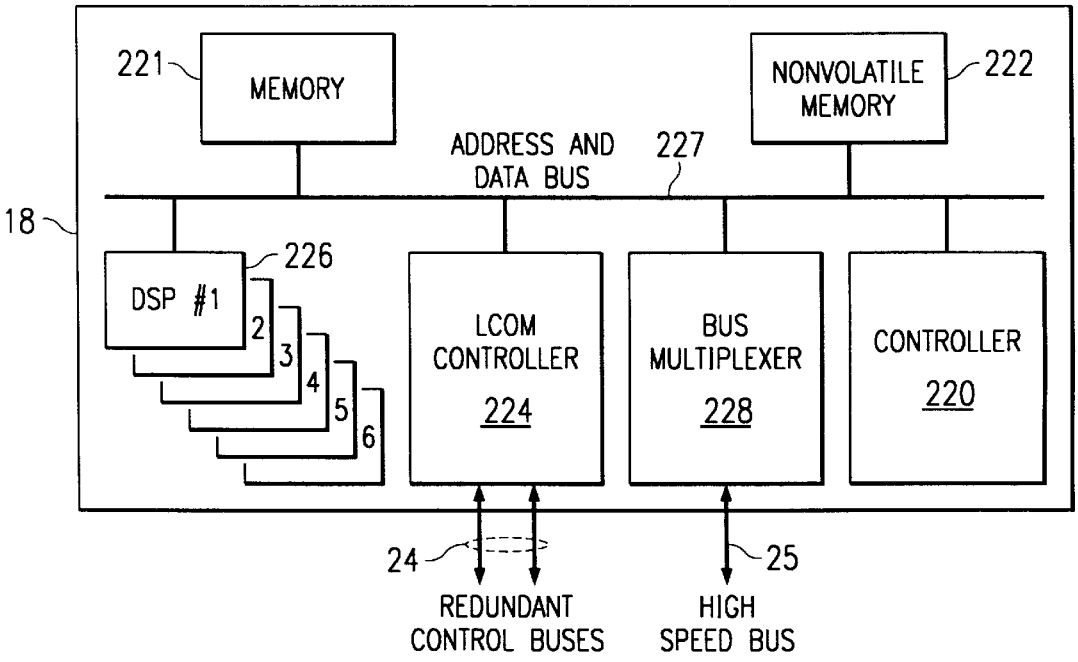
FIG. 10 is a block diagram of the telephony-support module of FIGS. 1–2.

With reference now to FIG. 10, a block diagram of the telephony support module 18 is shown. Depending upon system needs, there could be a single telephony support module 18, or there could be provided a redundant support module 18. If a redundant setup were used, the telephony support modules 18 would be placed on a single high-speed bus 25 as shown in FIG. 2. Like the interface module 20, the telephony-support module 18 comprises a controller 220 for managing the functions provided by the telephony-support module 18. Also like interface module 20, there is provided a memory 221 for real-time executable code storage and a nonvolatile memory 222 for storage of, for example, the telephony support module's boot code or other nonvolatile code. Another purpose served by the nonvolatile memory 222 within the telephony-support module 18 could be for storage of voice messages when voice messaging is a function supported by the telephony switching platform 10.

Again, like the interface module 20, the telephony support module 18 includes a controller 224 that is operable to communicate with the other resource processors 18, 20, 22, and particularly with the switching module 16 through the redundant control buses 24.

Functions that may be provided by the switching platform 10 include conferencing, voice messaging, and telephony support functions such as busy signals, ring signals, trunk busy signals and other functions. For example, when a telephone subscriber wishes to place a call, the phone number is entered by pressing numbers on the keypad of his phone. The phone generates DTMF tones that identify each number that is pressed. These tones are passed over an information channel associated with the calling subscriber. The switching platform 10 processes these DTMF tones by switching them to one of the resource processors, e.g., the telephony support module 18, which decodes the DTMF tones. Once these tones have been decoded, the call processor 12 seeks to make a connection in accordance with the entered phone number. The call processor 12 determines which information channel should be connected through to the subscriber. As the switching platform 10 seeks to make a connection to the number sought by the subscriber, tones are provided by the telephony support module 18 to the subscriber's assigned information channel. These tones would include busy signals and ring signals. Throughout the establishment of a connection, the switching module 16 is continually making and breaking new connections between the subscriber's assigned information channel and various resources within the switching platform 10.

With further reference to FIG. 10, the function of generating and interpreting tones that are carried over the information channels is called upon when the switching platform 10 is attempting to establish connections between a subscriber and the party that the subscriber has dialed. The telephony support module 18 interprets the DTMF tones entered by the subscriber, and provides either a busy signal, a ring signal, or some other signal, as the switching platform 10 attempts to make a connection to the called party. The DSPs 226 are responsible for this tone interpretation and generation. A bus multiplexer 228 is provided to make the appropriate connections between information channels that have been routed to the telephony support module 18 and to the appropriate resources within the telephony support module 18. Specifically, under the direction of a controller 220, the bus multiplexer places incoming tones signals on the appropriate timeslot to be interpreted by one of the DSPs 226, and will read signals from the DSPs 226 and place them on that high-speed bus 25 in the appropriate timeslot. Also, under direction of the controller 220, voice messages will be played back from the nonvolatile memory 222 or stored therein. Again, the bus multiplexer 228, under the controller's 220 direction, will extract the incoming voice channels from the appropriate timeslots of the high-speed bus 25 and direct them to the appropriate address within the nonvolatile memory 222. In the reverse direction, the bus multiplexer 228 will read the stored messages from the nonvolatile memory 222 and place these messages in the appropriate timeslot on the high-speed bus 25.

Figure 11:
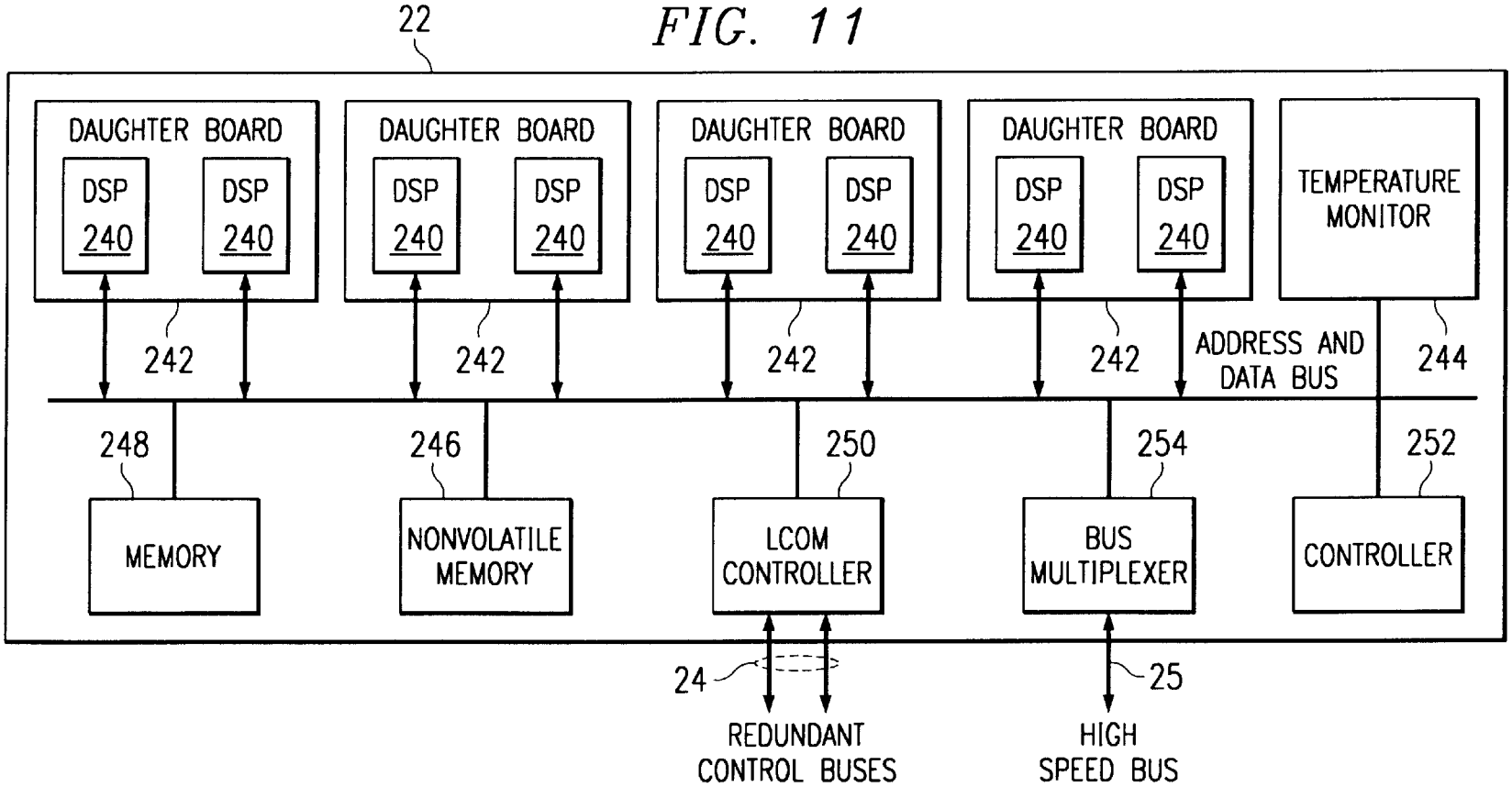
FIG. 11, is a block diagram of the signal-processing module of FIGS. 1–2.

With reference now to FIG. 11, a block diagram of an embodiment of the signal processing module 22 is shown. The signal processing module 22 is designed for rate-adapting the 16 Kbps GSM-encoded information channels 49 to and from the 64 Kbps PCM-encoded information channels 48. This function is carried out, for example, by digital signal processors ("DSPs") 240. To allow flexible provisioning in this embodiment, the DSPs 240 are housed on daughter-boards 242. Up to four daughter-boards may be installed on the main module, although fewer daughter boards can be used if a full complement of daughter boards 242 is not required. In this embodiment, the daughter-boards 242 are physically large enough to hold two DSPs 240 each. Assuming, for example, that each DSP can handle four GSM-encoded voice channels 49, the signal processing module 22 thus provides up to 32 GSM ports in eight-port increments. The temperature monitor 244, the nonvolatile memory 246, the memory 248, the controller 250, and controller 252 perform essentially the same functions as do the analogous components in the other resource processors 18, 20.

The bus multiplexer 254 in the signal processing module 22 is responsible for connecting, under control of the controller 252, information channels from the PCM high-speed bus 25 to the DSP 240 signal processing resources. In addition to performing a rate adaptation, the DSPs 240 can be called upon to perform echo canceling when that function is required, particularly when the switching platform 10 is handling GSM-encoded voice channels 49 for example as described in U.S. patent application No. 08/678,254, which is hereby incorporated by reference.. To maximize timeslot flexibility, in an embodiment of the present invention, two 32-timeslot highways are available to each daughter-board 240. Thus, a fully populated signal-processing module 22 would occupy slightly less than one third of a 128 channel, 8.192 Mbps high-speed data bus 25. Accordingly, as shown in FIG. 2, each signal processing module 22 can share its high-speed data bus 25 with two other signal-processing modules 22.

FIG. 3 shows how telecommunications channels may be multiplexed onto a single high-speed bus 25. In this embodiment, 128 traffic and/or information channels are multiplexed together to form a single frame that repeats every 125s. Each of the timeslots 46, which are numbered 1 through 128 in FIG. 3 and begin repeating again after 128 timeslots, preferably comprises a group of eight contiguous bits occurring every 125s. These repeating groups of bits are designated in the exemplary timeslot 1 (as shown by the break-out figure for that timeslot) as B0 through B7.

Figure 4:
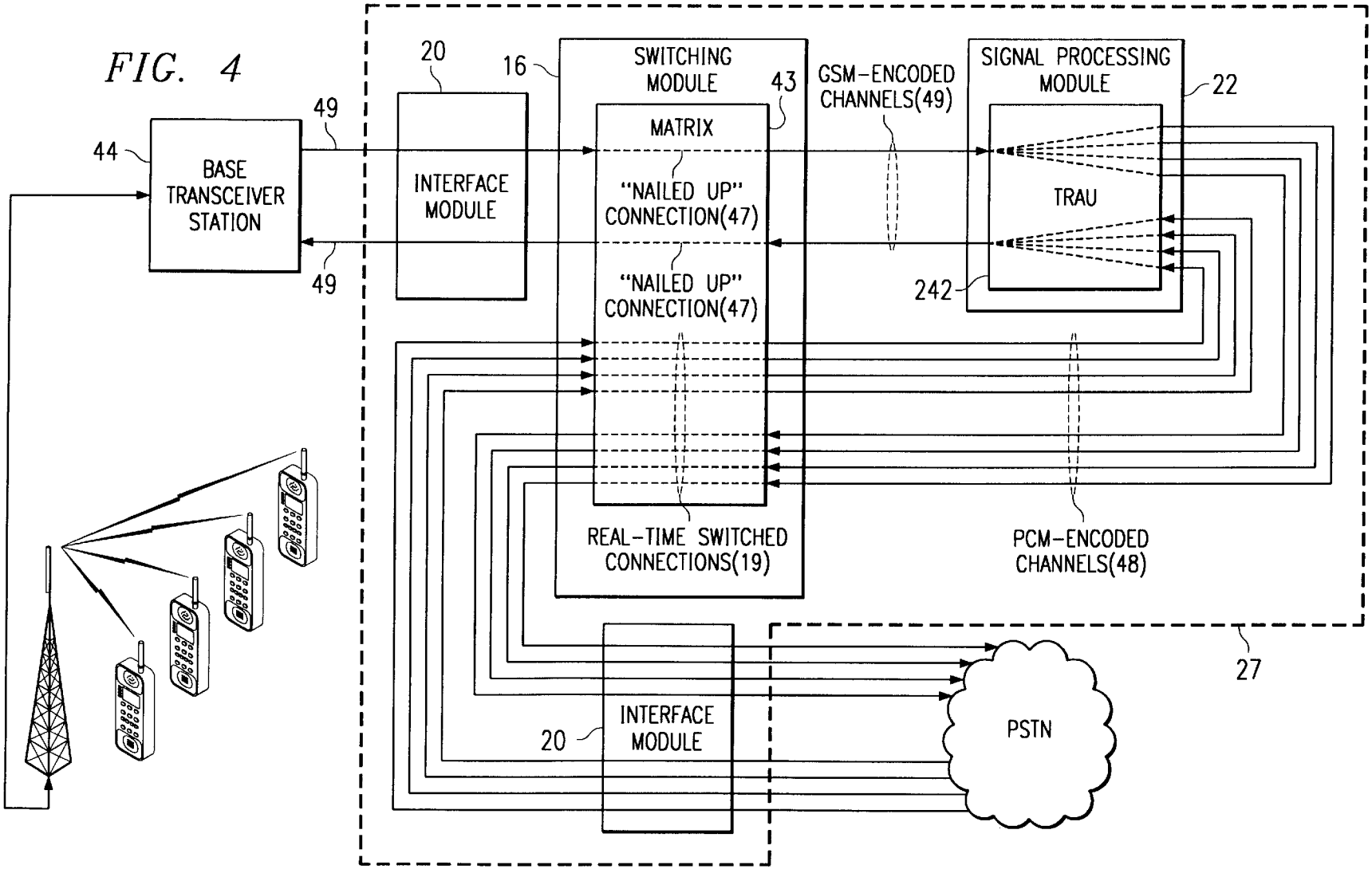
FIG. 4 is a system-level block diagram illustrating how connections may be formed through the telecommunications switching platform of FIG. 1.

FIG. 4 illustrates how connections may be formed through a telecommunications switching platform 10. In this embodiment, four GSM mobile phones are shown in wireless communication with a BTS 44. By the time the GSM-encoded voice signals are transmitted from the BTS 44 to the switch platform 10, they form a 64 kbps DSO information channel 49, which would preferably be transmitted within a telecommunications span 40 as discussed above. The span 40 is then received by the interface module 20 and is passed from there to the switching module 16. Because there is no reason to change the assignment of this GSM-encoded information channel 49 into the switching module 16, and because the GSM-encoded information channels 49 will preferably always have to be rate-adapted by the signal processing module 22 (in addition to the other signal processing functions the signal processing module 22 may provide, which will be later described), it is advantageous to semi-permanently connect and assign the information channel to the signal-processing module 22. This semi-permanent connection is referred to as an "nailed-up" connection 47. In conventional switching platforms, the addressing information required to maintain this connection through the switch 43 is stored in a table within the switching module 16. The addressing information would be maintained there until the system is reconfigured or until an error occurred such as a component failure or a board is removed—which would require the connections to be reconfigured. According to an embodiment of the present invention, however, the addressing information can be dynamically changed to reallocate the connections of selected companies.

Still referring to FIG. 4, within the signal processing module 22, a DSO channel comprising four 16 kbps GSM voice channels is expanded into four PCM-encoded information channels 48. This expansion is shown within the Transcoder Rate Adaptation Unit (TRAU) functional block of the signal-processing module 22. These four PCM-encoded voice channels are then passed again back through the switching module 16. Since these various voice channels are switched in real time so that the GSM telephone users can make and receive phone calls to different individuals, the switching module 16 makes real-time switching assignments or connections 19 for these PCM-encoded voice channels 48. Thus, the switching module 16 dynamically updates the connection information describing how the circuits will be switched through the switch 43. In this example, the four PCM-encoded voice channels 48 are all passed through the same or a different interface module 20 and are then transmitted to the Public Switched Telephone Network (PSTN).

A GSM caller may also call another GSM mobile telephone. In that circumstance, one of the PCM-encoded voice channels 48 would be re-routed through the switch 43 to another channel of a signal-processing module 22 to be rate-adapted back to a 16 kbps GSM-encoded information channel 49 and then passed again through the switching module 16 and through the original or another interface module 20 to the same or another BTS 44.

FIG. 5 is a diagram showing the switching task that is accomplished by the switch 43 within the switching module 16. On the left-hand side of the figure, three exemplary bus inputs and outputs (high-speed buses 25) are shown. In the embodiments described above, there are twelve such high-speed buses 25 that pass through the switch 43. The switch is capable of receiving all of these buses and switching a timeslot from any position on any input bus 25 to any position on any output bus 25. For example, in this figure the data from timeslot 1 of input bus 9 (B1_1) is placed in timeslot 2 of output bus 1, as indicated by the arrow drawn between these positions. Similarly, the data from timeslot 2 of bus 1 (B1_2) is placed in timeslot 0 of output bus 2 (B2_0), and so on. For illustration purposes, a number of other channel connections are illustrated in this figure. In the preferred embodiment, the switch 43 is capable of connecting in this manner any of 128 timeslots on any of the twelve input buses 25 to any of 128 timeslots on any of twelve output buses 25.

Figure 6:
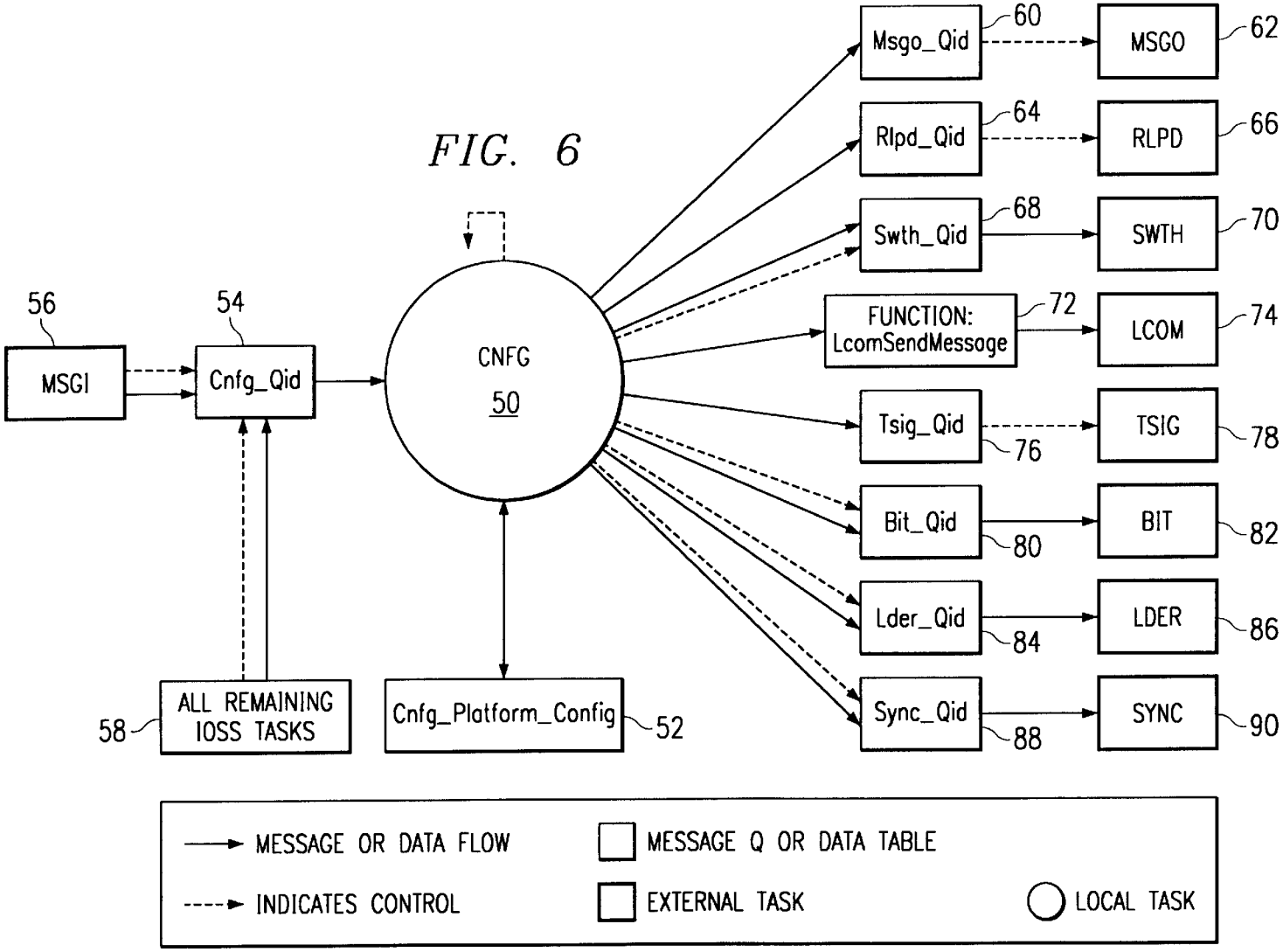
FIG. 6 is a task flow diagram illustrating the interfaces to a configuration task.

FIG. 6 is a task flow diagram illustrating the interfaces to a configuration task ("CNFG") 50 which executes in the switching module 16 and is responsible for all physical-configuration-related aspects within the platform (e.g., monitoring the number and type of boards, the backplane configuration, which connections have been "nailed-up," etc.). To maintain the platform database 52, which preferably includes a configuration table, messages containing configuration information are routed through CNFG 50. Upon receiving a message, CNFG 50 updates the database 52 as needed. If the message was destined for the switching module 16, CNFG 50 provides a response if needed. If the message was destined for one of the resource processors 18, 20, 22, CNFG 50 forwards the message to the appropriate resource processor 18, 20, 22.

According to an embodiment of the present invention, logical component identifiers (LCIs) are used as an addressing scheme to, for example, facilitate connections being made by the switching module 16. According to an embodiment of the present invention, an LCI is, for example, a 32 bit number that identifies the shelf, slot and board type by the upper 16 bits, the lower 16 bits of the LCI being context dependent as a function of the board type. LCIs can be made by any component needing to generate an LCI using, for example, a macro or function call that can take the underlying data, such as the shelf, slot, board type, etc. and put the data into the LCI 32 bit format. For example, LCIs can be generated by the call processor 12 for each of the spans 40 to identify to the switching module 16 the traffic channels and LAP_D channels that are to be added, as well as to make and break connections. Similarly, the switching module 16 can generate LCIs to establish nailed up connections, the various LCIs generated representing, for example, the DSPs allocated to each nailed up connection as well as the physical or logical circuits allocated to a traffic channel. In addition, the LCIs generated according to an embodiment of the present invention can be used as indices to the CNFG database 52 illustrated in detail in FIGS. 12A and 12B and discussed below.

The CNFG task 50 provides an interface to translate LCIs into high-speed bus 25 and timeslot 46 data for a SWTH task 70. The SWTH task establishes connections in the switch 43. These logical identifiers serve as indices to configuration database 52 that provides physical connection information to the CNFG task 50. CNFG task 50 passes the connection information to the switch 43 to make the appropriate connections between information channels on the high-speed buses 25. The CNFG task 50 will determine certain LCIs at system start-up.

An example of the building of a LCI is during system startup, at which time the switching module 16 receives description data from each installed resource processor 18, 20, 22, for example in the form of a registration message. When the registration information is received by the switching module 16, the CNFG task 50 utilizes the registration information (e.g., shelf, slot, board type) and builds a board LCI for each resource processor 18, 20, 22. The call processor 12 can also build LCIs. For example, the call processor 12 includes initial information on the components of the system (e.g., based on information manually provided by an operator during installation of the system), such as span configuration and the configuration of individual timeslots. Thus, the information known by the call processor 12 as well as registration information provided from the switching module 16 to the call processor 12 at startup of the switching module 16 can be used by the call processor 12 to build LCIs for spans 40 on each interface module 20. The CNFG task 50 in the switching module 16 or the call processor 12 can use, for example, the exemplary macros set forth below to build and manipulate each LCI which can be implemented in the C programming language. For example, the MAKE macros put the data into the proper fields of the LCI while the GET macros allow retrieval of the particular fields of interest in the LCI.

```
// LCI Construction Macros
#define
MAKE_TRUNK LCI(SHELF,SLOT,BD_TYPE,SPAN_TYPE,SPAN,
LCKT)
#define MAKE_SPAN_LCI(SHELF,SLOT,BD_TYPE,SPAN_TYPE,
SPAN)
#define MAKE_BOARD_LCI(SHELF,SLOT,BD_TYPE)
#define MAKE_CC_LCI(SHELF,LCKT)
#define MAKE_DSP_LCI(SHELF,SLOT,DSP)
#define MAKE_SPM_TEST_LCI(SHELF,SLOT,CHAN)
#define MAKE_SPM_CHAN_LCI(SHELF,SLOT,DSP,CH)
#define MAKE_PSM_CHAN_LCI(SHELF,CH)
#define MAKE_CONFERENCE_LCI(SHELF,CONFID,
        MUSACPORT)
// LCI Extraction macro's
#define GET_SHELF_FROM_LCI(LCI)
#define GET_SLOT_FROM_LCI(LCI)
#define GET_SPAN_TYPE_FROM_LCI(LCI)
#define GET_SPAN_FROM_LCI(LCI)
#define GET_CKT_FROM_LCI(LCI)
#define GET_BD_TYPE_FROM_LCI(LCI)
#define GET_DSP_FROM_LCI(LCI)
#define GET_PSM_CHAN_FROM_LCI(LCI)
#define GET_SPM_TEST_CHAN_FROM_LCI(LCI)
#define GET_CONF_ID_FROM_LCI(LCI)
#define GET_PORT_FROM_CONF_LCI(LCI)
```

According to an embodiment of the present invention, LCIs are 32 bits although all of the bits may not be used for each LCI. For example, when addressing IOSS Platform boards 27, the LCI is constricted using the shelf, slot, and interface fields. Any remaining fields will be set to NONE. All boards within the IOSS Platform 27 (e.g., resource processors 18, 20, 22) are addressable in this manner. The below table demonstrates Board LCI 0x0054FFFF, residing at slot 5 on shelf 0 and is a board type 4, which an arbitrarily selected designation for an interface module 20 according to an embodiment of the present invention.

| Shelf | Slot | Board Type | Span Type | Span | Logical circuit |
|---|---|---|---|---|---|
| 4 bits<br>0x0 | 8 bits<br>0x05 | 4 bits<br>0x4 | 4 bits<br>0xF | 4 bits<br>0xF | 8 bits<br>0xFF |

Preferably, the upper or most significant 16 bits of the above exemplary 32-bit logical identifiers or LCIs consistently provide the same types of information, i.e., shelf, slot, and board type. The lower 16 bits are preferably context-sensitive, depending upon the type of resource or communication channel that is being identified. 0x indicates a hexadecimal number. To make this LCI, the shelf slot and board type data (e.g., 0, 05, 4) would be provided to the the MAKE_BOARD_LCI macro which would generate the LCI. Similarly, to extract data from this LCI (e.g., when the LCI is received at its destination), the appropriate GET macro would be used to extract the necessary information based on the message type (e.g., adding a traffic channel requires extracting the span field).

To create a LCI for a span 40 on an interface module 20, a trunk LCI would be used to address individual circuits (e.g., DSOs) on an interface module 20. When the specified span being addressed is configured as a land span (e.g., a PSTN span), the physical circuits are used to construct the LCI, as each timeslot (DSO) on the span carries a PSTN traffic channel. However, if the specified span is configured as an air span (e.g., a GSM span), then logical circuits are used to do the mapping to the air traffic channel, as each physical timeslot (e.g., a 64kbps DSO) carries four air traffic channels (e.g., 4 16kbpsGSM traffic channels). Thus, a single span carries 32 physical timeslots addressed by a physical circuit, each physical timeslot supporting four air traffic channels resulting in 128 air traffic channels that can be addressed via a logical circuit. When nailing up a connection for an air span, however, logical circuits cannot be used because a single DSP supports one physical circuit and four logical circuits. Thus, the nailed up connection for four air channels uses the same DSP and thus the nailed up connection for the four air traffic channels must be use the physical timeslot of the DSP. Thus, according to an embodiment of the present invention, an air span LCI can contain a force physical bit that when set causes the appropriate physical circuit to be used for the nailed up connection, the force physical bit then being not set so that the logical circuits are used for call processing. The force physical bit can be, for example, the most significant bit (MSB) of the logical circuit field. Therefore, when specifying a trunk connection to the platform 27, LCIs for trunks may, for example, be constructed as follows:

| Shelf | Slot | Board Type | Span Type | Span | Logical circuit |
|---|---|---|---|---|---|
| 4 bits<br>0x0 | 8 bits<br>0x05 | 4 bits<br>0x4 | 4 bits<br>0x0 | 4 bits<br>0x0 | 8 bits<br>0x07 |

The above example is for a land circuit (also known as a PSTN trunk) having an LCI of 0x00540007. The first five fields are preferably fixed for all the LCIs on a particular span. The last field, "logical circuit," maps differently based on the interface and circuit type. In this example, the interface is an E1 standard land span indicated by 1x0 in the span type field and 7 in the logical circuit indicating timeslot 7 of the physical circuit (e.g., one of the 32 physical circuits on each span). An airspan would have a different span type and the logical circuit field would contain a number between 0 and 127 referring to one of the four logical circuits associated with each of the 32 physical circuits. For any DSO allocated for a LAPD channel, a group of four logical circuit numbers will be allocated but only the first will be used to access the LAP-D signaling channel.

When addressing spans 40, the LCI is constructed using all of the fields, except for the logical circuit field. The logical circuit field is preferably set in this circumstance to 0xFF. Spans 40 are preferably addressable via the interface modules 20. Both the Span LCIs and the Channel LCIs (eg., the last field of the LCI) refer to an interface module 20. Accordingly, the range of permissible values for "Slot" would be the same for either a Span LCI or a Channel LCI—specifically, the permissible range would be those slots where an interface module 20 could be placed on the shelf. Further the Board Type would be the same for either, specifically "4" in this exemplary embodiment referring to an interface module 20. The Span Type and Span for Channel LCIs and Span LCIs would also have the same range of values, as when identifying a particular Channel LCI, one must first identify the span 40 on which that channel is being carried. The Channel LCI contains the additional, final field that identifies the time slot 46 of the information channel within a particular span 40. For land-based spans having 64 kbps PCM information channels, there will be 32 timeslots (or Channel LCIs) per Span LCI. Since GSM-based voice channels are encoded at 16 kbps, when the span 40 carries nothing but GSM-encoded voice channels there will be 128 timeslots or Channel LCIs per Span LCI (4 channels within each 64 kbps timeslot).

DSP LCIs are used when accessing signal processing module 22 or telephone support module 18 resources. DSP LCIs can be used to identify individual DSPs. The LCI below illustrates a DSP LCI.

| Shelf | Slot | Board Type | Unused | DSP | Channel |
|---|---|---|---|---|---|
| 4 bits<br>0x0 | 8 bits<br>0x0x | 4 bits<br>0x2 or 0x3 | 4 bits<br>0xF | 4 bits<br>0x0 | 8 bits<br>0xFF |

For a DSP LCI on a signal processing module 22, the DSP field ranges from 0–8 (e.g., there are 8 DSPs on each module 22) and individual DSPs are addressed 1–8 with 0 indicating a broadcast message to all DSPs. For a DSP LCI on a telephony support module 18, the DSP field ranges from 0–6 (e.g., there are 6 DSPs on a module 18) and individual DSPs are addressed 1–6 with 0 indicating a broadcast message. While a DSP LCI for a signal processing module identifies an individual DSP, the Channel field identifies whether the encoded DSP connection 48 or one of the decoded DSP connections 49. For a telephony support module 18, the Channel field represents, for example, the type of tone generated by the DSP.

According to an exemplary embodiment of the present invention, when forming connections, the application layer, which is comprised of the call processor 12, for example via a resource manager within the call processor 12, provides the LCI for the two endpoint information channels that the call processor 12 wishes to connect. The IOSS platform 27 forms all intermediate connections through the switch 43, including any connections that may be required through the signal processing modules 22 in a manner that is transparent to the call processor 12 and the resource manager.

This method and system for providing logical identifiers for components and communications channels provides a way to identify, preferably throughout the entire platform, all elements and channels to be connected and to make connections between those elements. A standard format is provided that builds up a LCI in a building block manner that can also be used as indices to a database of configuration information to allow dynamic updating of the database and remapping of connections without involving the call processor. In addition, the LCIs according to an embodiment of the present invention can be built as needed by various components thereby reducing the burden on the call processor to track an entire set of connections and allowing alternate connection paths to be established without invoking call processor logic. This provides significant flexibility over prior-art systems in which incoming lines, outgoing lines, and platformn resources are identified in a single list or database that is generally accessed by a single process that is responsible for managing the formation of these connections.

The CNFG task 50 provides a function to translate LCIs into the high-speed bus 25 and timeslot 46 information. This function preferably translates one or two LCI values with one operation. In an embodiment of the present invention, there are, for example, three parameters to this function: count; 1ci_xlate_ptr; and phys_xlate_ptr. The count parameter will specify the number of LCI values to translate. The preferred range is 1 or 2. The 1ci_xlate_tr points to a 32-bit array, maintained by the function requesting the translation, that contains the LCI values to translate. The phys_xlate_ptr points to an array of structures that will contain the translated line and slot data for each of the input LCI values that is also established by the function requesting the translation. This function returns a zero value, unless an error is encountered. LCIs that identify individual communications paths (timeslots on spans) will be translated to physical circuits within the IOSS Platform 27. Additionally, the CNFG task 50 (see FIG. 6) maintains the look-up tables needed to translate LCIs (see FIGS. 12A–12B).

Also, CNFG task 50 provides interfaces to report alarms and software errors. Alarms caused by the switching module 16 are considered local alarms, while alarms generated by resource processors 18, 20, 22 are considered remote alarms. In any case, both types of alarms are passed to the CNFG task 50 for processing. Operationally, this task 50 maintains and controls physical platform configuration information, hardware fail-overs, and process "hot-removal" and "hot-insertion" of resource processor or other boards. The CNFG task 50 also manages the state of the switching module 16 and monitors the status of the resource processors 18, 20, 22 within the switching platform 10. CNFG 50 maintains a table of state information for each resource processor 18, 20, 22 and for the redundant switching modules 16.

As shown in FIG. 6, the CNFG task 50 interfaces with the resource manager software modules running on the call processors 12 and many of the other tasks executing within the IOSS platform 27. These interfaces may be implemented, for example, by the use of message queues. CNFG 50 interfaces with each task's command mailbox. The CNFG 50 task accepts commands through its message queue, Cnfg_Qid 54. In an embodiment of the present invention, the messages arriving in the queue 54 via MSGI task 56 originated in the Resource Manager.

After processing startup initialization functions, this CNFG task 50 is driven by, for example, an event flag. The event flag indicates that a message has been placed in CNFG's message queue, Cnfg_Qid 54. Preferably, all configuration-related messages pass through CNFG 50. The CNFG task 50 may be commanded by the Resource Manager to issue state-change commands (e.g., ONLINE, OFFLINE) to boards residing within the IOSS platform 27. Also, board additions and removals are preferably detected and reported to this task. Finally, in addition to maintaining platform configuration, this task effects redundant fail-overs when necessary.

All objects required by the CNFG task 50 are preferably available at startup. The CNFG task 50 starts by initializing itself and resetting all configuration tables. During startup, the task reads a system information and status register on the switching module 16. The results of this read are then made available to the other tasks within the IOSS platform 27. This information is also preferably made available in a global data structure. Information that may be included in this global data structure include, for example, the following fields:

| | |
|---|---|
| write_protect: | Indicates whether the bootstrap portion of the IOSS platform 27 is write protected |
| shelf address: | Indicates on which shelf of a telecommunications rack the IOSS platfrom resides |
| slot_id: | Indicates in which slot of a telecommunications rack shelf a module has been placed |
| hardware info: | may be used to provide model and revision information for the rack backplane and/or module PCB |

The IOSS software includes, for example, the following tasks:

| | |
|---|---|
| BIT 82 | Built In Test |
| CNFG 50 | Configuration |
| LCOM 74 | Local Communications |
| RLPD 66 | Remote LAP-D |
| SWTH 78 | Switch |
| TSIG 78 | Trunk Signaling/PCM Message support |
| WDOG (not shown) | Watchdog |
| TONE (not shown) | Tone control |
| SYNC 90 | Redundancy control |
| HFSP (not shown) | Handoff and clock slip processing |
| TSIG 78 | TSI supplied LAPD stack tasks. |

The Message Router In 56/Message Router Out 62 (MSGI/MSGO) tasks is one point of communication between the IOSS platform 27 and the Resource Manager, and is preferably implemented through a pNA socket interface. MSGI 56 reads from a socket and routes the messages to the proper destination within the IOSS platform 27. Messages may be delivered locally to other tasks executing on the switching module 16, over a remote LAP-D link to the BTS 44, or over the LCOM link 24 to various resource processors 18, 20, 22. MSGI 56 blocks on socket reads if data is not available. MSGO 62 preferably uses one input message queue, blocks on a read from the queue, and delivers the messages to the proper destination.

The Loader (LDER) task 86 performs downloads to nonvolatile memory 160 and is the file handler for downloads to the resource processors 18, 20, 22. Download messages are received from Resource Manager (RM) via the MSGI task 56. The download messages may indicate boot block loads, executable loads, or loads to Field Programmable Gate Arrays (FPGAs) in the resource processors 18, 20, 22 or switching module 16. For each of the three downloadable entities managed by LDER 56, there is a known file name that LDER 56 will use. These files preferably reside on a disk that is capable of being NFS-mounted and accessed directly by LDER 56. The results of the download will be sent up to the Resource Manager through MSGO 62.

The Built-In Test (BIT) task 82 will, under normal operation, periodically execute a list of built-in diagnostic tests. The BIT task 82 is described generally below, and in detail in U.S. patent application No. 09/026,467, entitled FAULT TESTING IN A TELECOMMUNICATIONS SYSTEM (docket No. 24194000.185), filed Feb. 19, 1998, which is incorporated by reference herein. On each iteration of a test, BIT 82 attempts. On each iteration of a test, BIT 82 attempts to test, for example, either a resource processor 18, 20, 22 or a DSP. Statistics preferably will be maintained, indicating the number of tests performed or attempted per timeslot.. A failed BIT, based on specific data associated with each test, will cause an alarm to be sent to CNFG task 50 that may result in a request to fail-over to a redundant component.

To maintain the platform configuration information, CNFG task 50 handles resource processor 18, 20, 22 board insertions and extractions. The removal of any resource processor 18, 20, 22 is preferably detected at run-time by LCOM 74 and reported to CNFG 50. The Resource Manager detects the removal of a switching module 16 at run-time. CNFG 50 reports the board removal (except for switching module 16 removal) to the Resource Manager and adjusts the database 52 to reflect the new hardware status. Additionally, CNFG 50 generates disconnect commands for SWTH 70 if the board removed was currently in use. If a switching module 16 is hot-inserted into the IOSS platform 16, it will automatically become the off-line switching module 16. The SYNC task 90 ensures that the newly-inserted switching module 16 is synchronized as quickly as possible with the existing switching module 16 in case a failover is necessary. If a telephony-support module 18 is hot-inserted into a system, it automatically becomes an off-line slave.

Any signal processing modules 22 added to the IOSS platform 27 at run-time are also detected by LCOM 74 and reported to CNFG 50. CNFG 50 reports the board addition to the Resource Manager and adjusts the database 52 to reflect the new hardware status. SWTH 70 does not need to be told about signal-processing module 22 additions. Adding a signal-processing module 22 will increase the pool of DSPs 240 (see FIG. 11) available to the IOSS platform 27.

With continued reference to FIG. 6, any interface modules 20 added to the IOSS platform 27 at run-time are detected by LCOM 74 and reported to CNFG 50. In this embodiment, CNFG 50 reports the board addition to the Resource Manager and then adjusts the database 52 to reflect the addition. CNFG 50 preferably will not by itself place the new spans 40 into service. If spans 40 are connected, TSIG 78 receives a message indicating that the span 40 is active. The Resource Manager then requests that the specified span 40 be brought into service.

The Local Communications (LCOM) task 74 establishes and maintains a point-to-multipoint connection and connectivity to the resource processors 18, 20, 22 within the IOSS platform. In one embodiment, each resource processor 18, 20, 22 within the IOSS platform uses its slot id as its identifier. LCOM 74 identifies resource processors 18, 20, 22 that are currently active in the IOSS platform 27 and periodically polls unused slots to determine if a board has entered the system. LCOM 74 recognizes and reports when resource processors 18, 20, 22 are no longer communicating or when one of the links has failed.

Still referring to FIG. 6, the Remote LAP-D (RLPD) task 66 provides all communications to the BTS 44. RLPD is accessed via special messages from Resource Manager to establish connections, pass messages to the BTS 44 and release connections.

The Switch (SWTH) 70 task services the Resource Manager. SWTH 70 receives messages from the Resource Manager, via MSGI 56. Based on the received message, SWTH 70 makes the necessary connections through the switch 43. The results of commanded actions will be sent to the Resource Manager through MSGO 62. Another function of SWTH 70 is to service BIT 82 requests to establish connections to perform testing. SWTH 70 maintains a table indicating current timeslot connections and status (operational, BIT, unused, etc.).

Preferably, all of the connections in the interface modules 20, signal processing modules 22 and telephony support modules 18 will be "nailed-up" connections 47 so that reql time switching occurs primarily in the switching module 16. BIT 82 will also be able to request temporary loop-back connections. The resource processors 18, 20, 22 can be initialized to their "nailed-up" connections 47, but will also respond to run-time commands requesting connections or disconnections.

The Watchdog (WDOG) task (not shown) periodically services a hardware watchdog to prevent system resets. This task also polls the system information and status bits to determine a change of bus ownership state. If a change is detected, a message will be sent to CNFG 50. Additionally, this task will flash an LED to indicate that the IOSS platform 27 is running.

Figure 7:
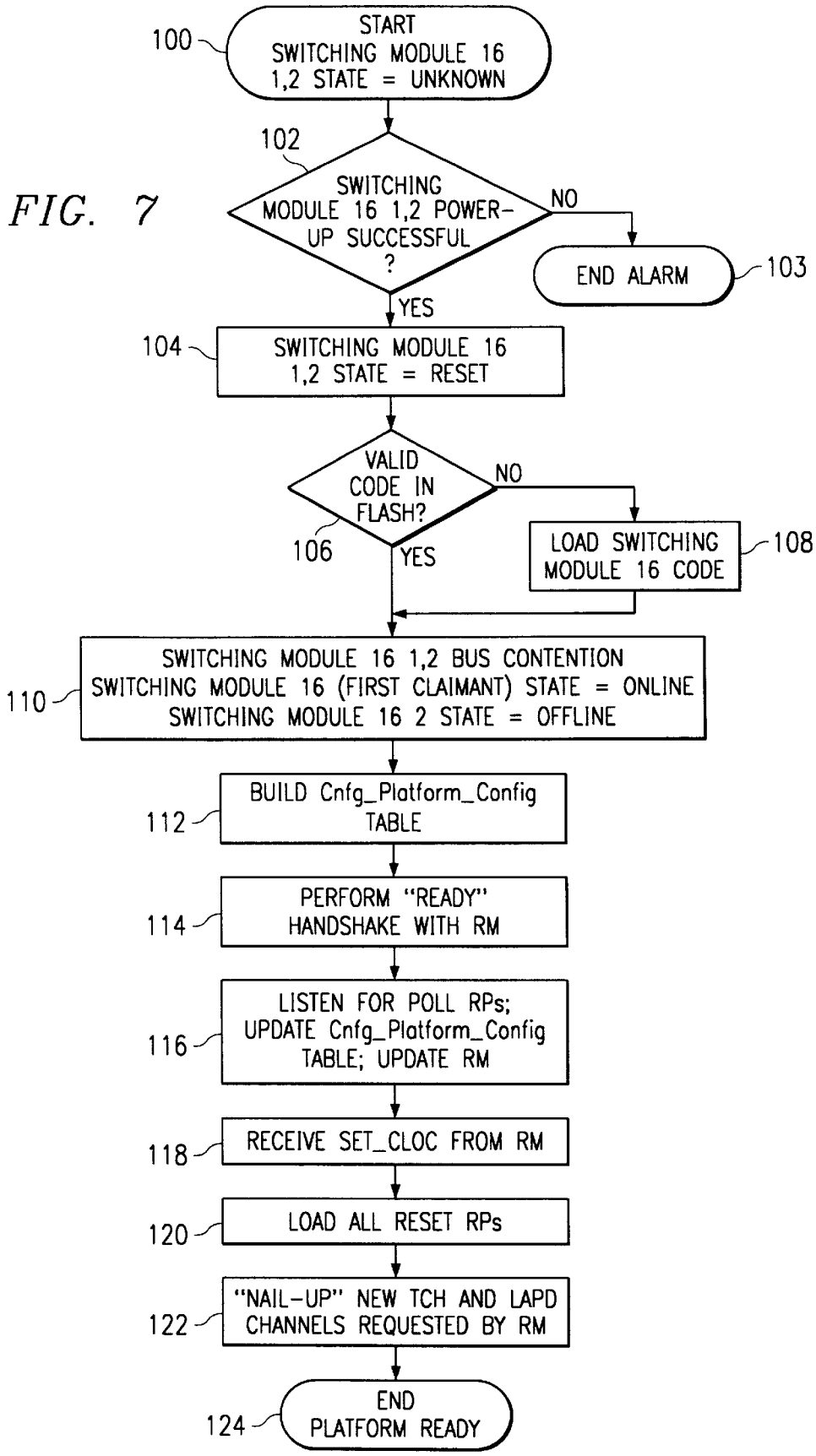
FIG. 7 is a flow diagram of the steps taken by the upon startup of the telecommunications switching platform.

FIG. 7 is a flow diagram of the steps taken by the CNFG task upon startup of the IOSS platform 27. After initialization of the switching module 16, CNFG task 50 builds up empty configuration tables based on its read of the system information and status register (e.g., stored in a hardware register of the switching module 16) and described further with regard to FIGS. 12A and 12B.

Figure 12A:
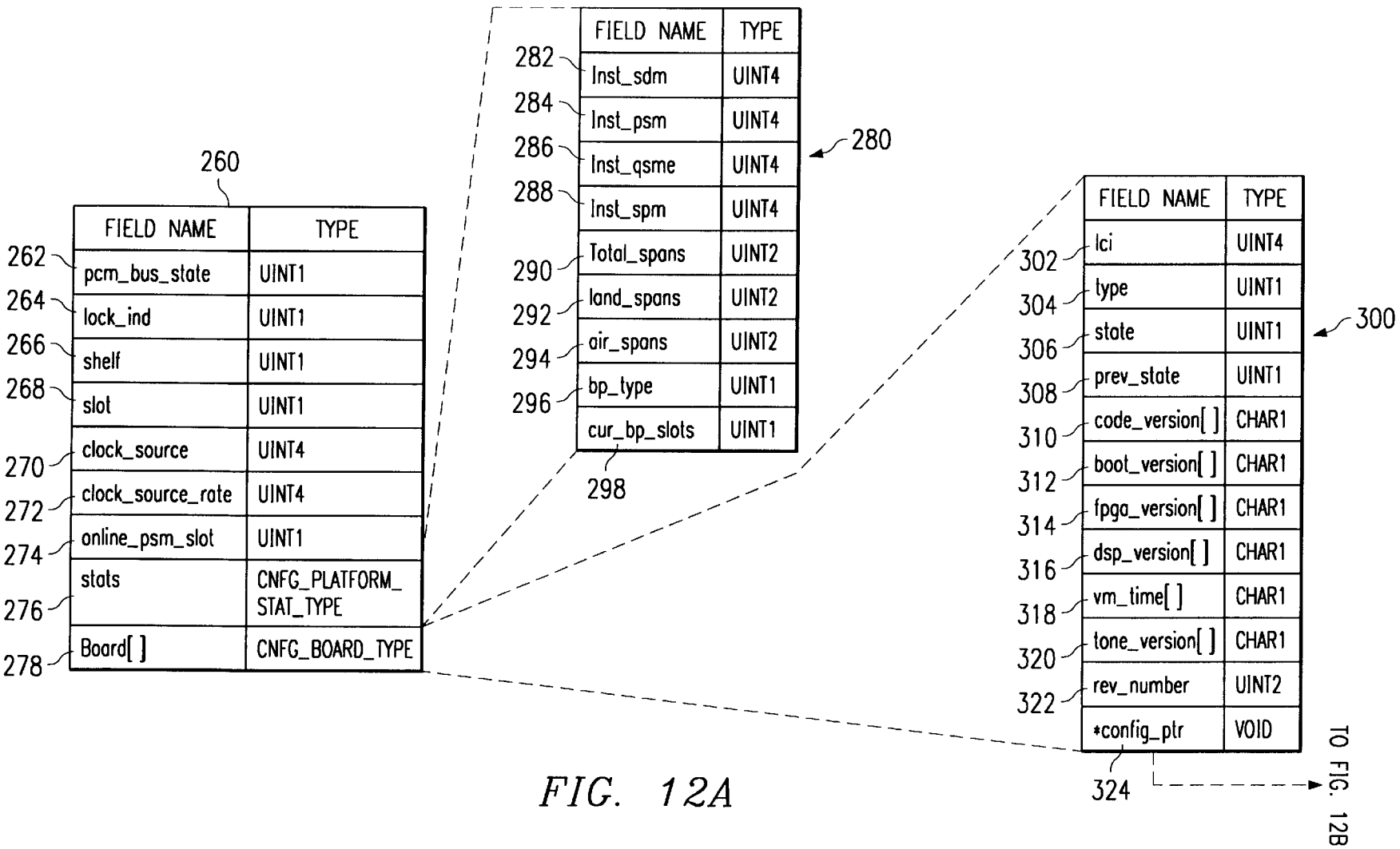
FIGS. 12A–12B are a block diagram illustrating a configuration table used to store Logical Component Identifiers (LCIs) and other information concerning system resources and information channels.
Figure 12B:
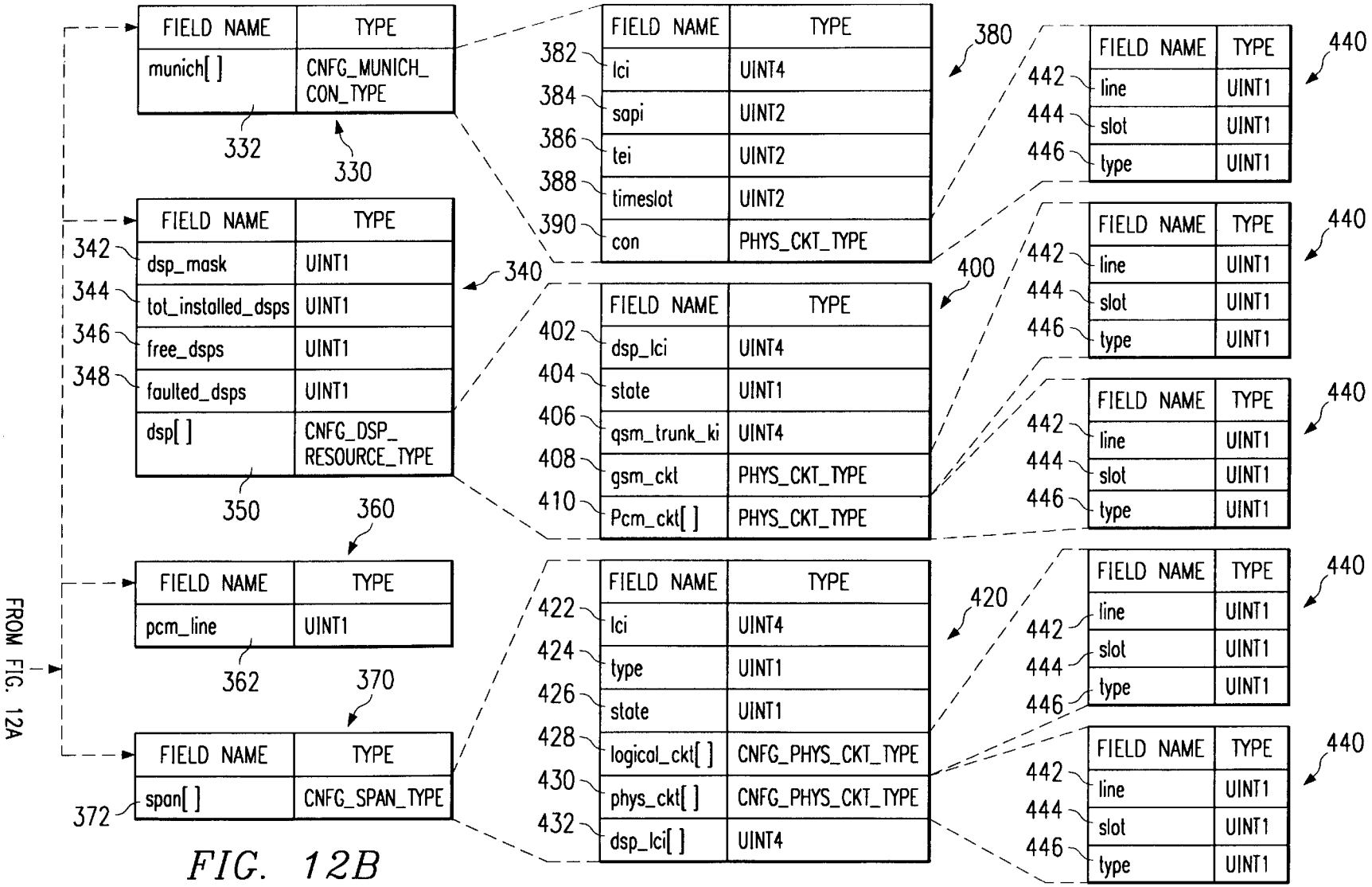

As shown in FIG. 7, the configuration table 52 is initially constructed in step 112 as an empty table whose size and fields are determined by what the CNFG task 50 has read from the information and status register of the switching module 16. Once the empty configuration table 52 has been constructed in step 112, at step 114 each switching module 16 sends a "Ready" message to the Resource Manager. Each switching module 16 at this time also reports its state, i.e., one of the switching modules 16 is ONLINE while the other switching module 16 is OFFLINE. The switching module 16 that is ONLINE then begins at step 116 to receive configuration information from each resource processor 18, 20, 22 that is in communication with the switching module 16. Also at step 116, the switching module 16 continues after updating the configuration table 52 and provides the Resource Manager with this configuration information so that the Resource Manager can keep its system configuration database current. FIGS. 12A and 12B further illustrate the building of database 52.

The CNFG task 50 continues at step 118 in which the switching modules 16 receive a SET_CLOCK message from the Resource Manager. Both the ONLINE and the OFFLINE switching module 16 receive the SET_CLOCK message, so both of the switching modules 16 can be synchronized with the Resource Manager. For those resource processors 18, 20, 22 that are in the reset state, executable code is preferably loaded therein. In step 120, the Resource Manager issues LOAD messages for each resource processor 18, 20, 22 that is in the RESET state. The LDER task 86 (see FIG. 6) within the switching module 16 is responsible for processing these downloads to the resource processors 18, 20, 22.

With further reference to FIG. 7, the call processors 12 along with the switching modules 16 begin the task of assigning resources to traffic channels 49, and control and signaling (e.g., LAPD protocol in this embodiment) channels 48. This occurs at step 122, where the Resource Manager generates and sends ADD_TCH and ADD_LAPD messages to the CNFG task 50. At step 122, for each "add" message, the CNFG task 50 will establish "nailed-up" connections 47 through the necessary interface modules 20 and signal-processing modules 22 and will send appropriate connection commands to the SWTH task 70. Still at step 122, for all ADD_TCH messages, CNFG 50 will attempt to locate and assign (by issuing the nailed-up connection request to the SWTH task 70, see FIG. 6) signal-processing module 22 resources. For all ADD_LAPD messages, CNFG 50 will locate and assign (by issuing a nailed-up connection request to the SWTH task 70, see FIG. 6) LAPD controller resources within the switching module 16. Once these steps have been completed, the CNFG task is at step 124, and the IOSS platform 27 is ready to place calls.

FIGS. 12A and 12B illustrate an exemplary configuration table 52 used to store individual board configuration information and information used to translate Logical Identifiers or LCIs into switch 43 high-speed bus 25 and timeslot 46 information. The CNFG task 50 creates and maintains a global configuration table 260. The table 260 contains the necessary platform configuration data and will be modified by the CNFG task 50, but will be read by one or more tasks within the switching platform 10. The table 260 is preferably statically configured, assuming all slots used, with recommended board layouts but is by dynamically updated as needed. The fields, field types, and comments for table 260 are shown below.

When the switching module 16 starts up, each resource processor 18, 20, 22 connected to the switching module 16 checks in as described previously via a registration message. CNFG task 50 then updates the database 52. For example, the fields in table 260 can be updated as each board checks in. In particular, field 278 is an array field that is updated for each board (e.g., there are up to twenty entries of board data, one for each board). The contents of field 278 are shown at table 300 in FIG. 12A and described below.

| Field Name | Field Type | Comments |
|---|---|---|
| Pem_bus_state (262) | UINT1 | Indicates which of the redundant switching modules is ONLINE and owning the high-speed buses 25. |
| Lock_ind (264) | UINT1 | Indicates lock state of switching module 16: CNFG_CMD_LOCK or ~CNFG_CMD_LOCK |
| Shelf (266) | UINT1 | Identifies whether the current shelf is shelf 0 or shelf 1 |
| Slot (268) | UINT1 | Identifies the slot in which the switching module 16 is: SDM_SLOT_A or SDM_SLOT_B |
| Clock_source (270) | UINT4 | Identifies the current clock source, e.g., INTERNAL_CLOCK, CLOCK_1, CLOCK_2, CLOCK_3, or CLOCK_4 |
| Clock_source_rate (272) | UINT4 | Indicates the current clock source rate: SPAN_TYPE_E1 or SPAN_TYPE_T1 |
| Online_psm_slot (274) | UINT1 | Identifies the slot of the ONLINE telephony-support module 18. |
| Stats (276) | CNFG_PLATFORM _STAT_TYPE | Is a structure 276 containing counts of installed hardware components. |

-continued

| Field Name | Field Type | Comments |
|---|---|---|
| Board[] (278) | CNFG_BOARD_TYPE | Is an array 278 of specific board-related data. This array is preferably sized to be one greater than the largest number of boards that may reside in the switching platform 10. The extra slot is used for cross-connects |

As the resource processors 18, 20, 22 check in with the switching module 16, the registration information is used by CNFG task 50 to update the stats field 276, which contains, for example, information concerning the number and type of boards installed in the switching platform 10, along with the total number and allocated number of various system resources. The stats filed 276 contains, for example, the field names and types set forth below.

| Field Name | Field Type | Comments |
|---|---|---|
| Inst_sdm (282) | UINT4 | The bit position indicates the card-rack slot and the number of bits set indicate the number of installed boards. |
| Inst_psm (284) | UINT4 | Same as above |
| Inst_qsm (286) | UINT4 | Same as above |
| Inst_spm (288) | UTIN4 | Same as above |
| Total_spans (290) | UINT2 | Total number of span interfaces known to the platform |
| Land_spans (292) | UINT2 | Number of spans 40 allocated to land circuits |
| Air_spans (294) | UINT2 | Number of spans 40 allocated to air circuits |
| Bp_type (296) | UINT1 | Current backplane type |
| Cur_bp_slots (298) | UINT1 | Current member of backplane slots |

The land-spans field 292 and air-spans field 294 define the number of spans 40 allocated to land and air circuits. For example, there will be a defined number of radios associated with a particular switching platform 10 and thus there exists a defined number of air traffic channels to be assigned by the call processor 12. As the equipment associated with the switching platform 10 is known to the application processor 12, the application processor, at the time of system initialization, can determine the allocation of spans 40 between land and air.

The board field 278 of the configuration database 260 is, for example, an array field and contains board-related information and is dimensioned to have an array size of one more than the largest number of boards ("n") that may reside in the switching platform 10. Backplane slots are numbered 1 to n. The resource processors 18, 20, 22 will report their slot numbers to CNFG 50 when the resource processors check in with the switching module 16. Array 278 thus contains information concerning each resource processor 18, 20, 22 currently registered with the switching module 16. The registration information provided to switching module 16 in combination with the configuration information known by the call processor 12 and provided to the switching module 16 allows the CNFG task 50 to update tables 260, 280 and 300, including building board LCIs to be stored in field 302 (e.g., the upper 16 bits of the LCI —shelf, slot, board type).

Figure 13A:
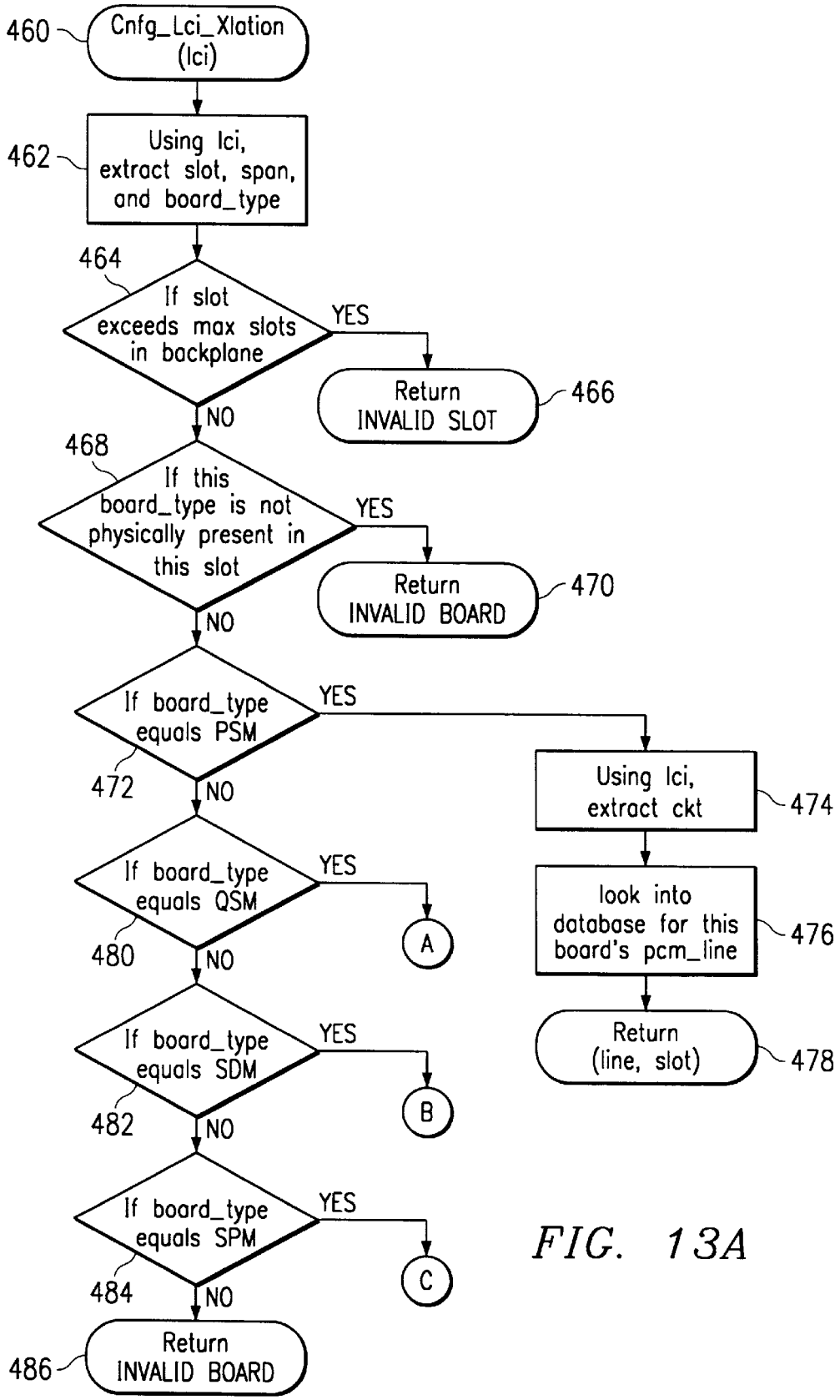

Array 278 will also be used to translate LCI values to switch 43 high-speed bus 25 and timeslot 46 information, also described with respect to FIGS. 13A and 13B. Board types for every slot will start in table 300 as NO_BOARD in field 304, and are updated as boards register. Board states will start as UNKNOWN and are updated as boards register. The config_ptr field 324 is then cast to an appropriate board type, based on the type field. For example, a signal processing module 24 board would cause field 324 to be set to the signal processing board type and would provide a pointer to, for example, table 346 shown in FIG. 12B. As long as the type field is NO_BOARD, no attempt is made to access this pointer. During CNFG's 50 initialization, the config_ptr field 324 of each array element will be set to the address of a statically-allocated structure of the recommended board type for each slot, based on backplane type. Once set, this field 324 will preferably not change unless a system reset is performned.

| Field Name | Field Type | Comments |
|---|---|---|
| LCI (302) | UINT4 | Board LCI value. |
| Type (304) | UINT1 | Board type: NO_BOARD, BOARD_SDM, BOARD_SPM, BOARD_PSM, BOARD_QPM_E1, BOARD_QPM_T1 |
| State (306) | UINT1 | Board state: UNKNOWN_ST, RESET_ST, OFFLINE_ST, ONLINE_ST, ERROR_ST, IN_TEST_ST, LOADING_ST |
| Prev_state (308) | UINT1 | see state field above |
| Code_version[] (310) | CHAR1 | An array of CODE_VERSION_LENGTH bytes used to contain the code version for a specific board. |
| Boot_version[] (312) | CHAR1 | An array of CODE_VERSION_LENGTH bytes used to contain the boot version for a specific board. |
| Fpga_version[] | CHAR1 | An array of VERSION_LENGTH bytes used to |

-continued

| Field Name | Field Type | Comments |
|---|---|---|
| (314) | | contain the FPGA version of a specific board. |
| Dsp_version[] (316) | CHAR1 | An array of CODE_VERSION_LENGTH bytes used to contain the FPGA version for a specific signal-processing module 22 or telephony-support module 18. |
| Vm_time[] (318) | CHAR1 | An array of CODE_VERSION_LENGTH bytes used to contain the voice message version for a specific telephony-support module 18. |
| Tone_version[] (320) | CHAR1 | An array of CODE_VERSION_LENGTH butes used to contain the tone version for a specific telephony-support module 18. |
| Rev_number (322) | UINT2 | Hardware revision of board. |
| *config_ptr (324) | VOID | Cast to appropriate type, based on specified type field. No attempt to cast is made if type = NO_BOARD.<br>Valid casts:<br>SDM_BD - CNFG_SDM_BOARD_TYPE<br>SPM_BD - CNFG_SPM_BOARD_TYPE<br>PSM_BD - CNFG_PSM_BOARD_TYPE<br>QPM_E1_BD - CNFG_QPM_E1_BOARD_TYPE<br>QPM_T1_BD - CNFG_QPME_T1_BOARD_TYPE |

At this point, the registered hardware in the switching platform is ready to begin operation and the resource manager can send messages to the switching module 16 to add traffic channels or LAP-D channels. For each message to add a LAP_D channel, the CNFG task 50 will process the add message by locating and assigning a MUNICH32 resource via issuing a nailed up connection request to the SWTH task of the CNFG task 50. Table 330 shown below and in FIG. 12B contains field 332, which is an array of control channels used to communicate with a BTS.44. Field 332 is accessed via the config_ptr 324 field of the configuration database 260.

| Field Name | Field Type | Comments |
|---|---|---|
| BTS_Control[] (332) | CNFG_BTS_CONTROL_TYPE | An array of (NUM_BTS_CONTROL_CHAN) elements containing BTS_control channel assignment data. |

BTS_Control channels (sometimes specifically referred to as MUNICH channels because of the SIEMENS-proprietary Munich integrated circuits used in an embodiment of the present invention) are used to communicate with the BTS 44. This communication path is provided, for example, through an Abis interface and implemented with a LAP-D protocol. Each BTS_CONTROL channel may be associated with one timeslot 46 of a high-speed bus 25. The contents of field array 332 is shown below and as table 380 in FIG. 12B.

| Field Name | Field Type | Comments |
|---|---|---|
| LCI (382) | UINT4 | LCI of the interface module 20 trunk connected to this BTS_CONTROL channel. |
| Sapi (384) | UINT2 | Initial SAPI used by the LAP-D task to establish the control link. |

-continued

| Field Name | Field Type | Comments |
|---|---|---|
| Tei (386) | UINT2 | Initial TEI used by the LAP-D task to establish the control link. |
| Timeslot (388) | UINT2 | Physical timeslot 46 associated with the LCI |
| Con (390) | PHYS_CKT_TYPE | MTSL line & slot information for the PCM timeslots associated with this BTS_CONTROL |

-continued

| Field Name | Field Type | Comments |
|---|---|---|
| | | channel. |

If a signal processing module 22 checks in with the switching module 16 and, for example, a traffic channel is added, then the CNFG task 50 updates table 340 shown below and in FIG. 12B. Each signal-processing module 22 preferably contains 1 to 4 daughter boards 242, with each daughter board 242 containing two DSPs 240. The DSPs 240 are used to provide GSM encoding and are mapped into, for example, GSM_ABIS traffic channel circuits. Each DSP 240 is individually controllable. CNFG task 50 will statically allocate space for the maximum number of these structures needed. The table 340 is accessed through the config_ptr field 324 of the configuration database 260.

| Field Name | Field Type | Comments |
|---|---|---|
| Dsp_mask (342) | UINT1 | Mask indicating which DSPs 240 are installed. |
| Tot_installed_dsps (344) | UINT1 | Total number of DSPs 240 installed on this signal-processing module 22 board. |
| Free_dsps (346) | UINT1 | Number of DSPs 240 remaining to be used. |
| Faulted_dsps (348) | UINT1 | Number of faulted DSPs 240. |
| Dsp[] (350) | CNFG_DSP_RESOURCE_TYPE | A two dimensional array 350 used to access the DSPs 240 [MAX_SPM_DAUGHTER_BDS] [MAX _DSP_PER_DAUGHTER_BD] |

Each DSP 242 is indexed in the table 340 via dsp[] field 350. Thus, field 350 would have eight array entries, one for each DSP 242 on the signal processing module 22, the organization and content of the array for eacg DSP 242 shown below as table 400 and in FIG. 12B. As shown in table 400, for each DSP 242, a LCI is generated by the CNFG task 50 and stored in field 402. As each DSP utilizes five timeslots, five physical address locations on a pcm bus are stored in fields 408 and 410 For example, field 408 contains the physical circuit assigned to the DSP connection handling GSM encoded channels 49 and field 410 provides an array of the physical circuits assigned to the DSP connection handling the four resultant PCM encoded lines channels 48. Also shown in table 400 is field 406, which contains the span 40 that has been nailed up to the DSP 242 when a traffich channel was added. Field 406 contains the LCI of the appropriate span 40.

| Field Name | Field Type | Comments |
|---|---|---|
| DSP_lci (402) | UINT4 | Provides the LCI of the particular DSP 242. |
| State (404) | UINT1 | DSP_ALLOCATED, DSP_INSTALLED, DSP_TEST, DSP_FAILED, DSP_NOT_PRESENT |
| QSM_trunk_lci (406) | UINT4 | QSM trunk that has been 'NAILED-UP' to this DSP 242. |
| GSM_ckt (408) | PHYS_CKT_TYPE | High-speed bus 25 and timeslot information for the GSM-encoded timeslot assiciated with the particular DSP 242. |
| PCM_ckt[] (410) | PHYS_CHT_TYPE | An array 410 of MAX_TCH_ENCODED_PER_DSP(4) elements 440 containing high-speed bus 25 and timeslot information for the PCM timeslots associated with the DSP. |

When a telephony support module 18 registers with the switching module 16, the CNFG task 50 maintains the pcm_line that is associated with the module 18 as shown below in table 360 and in FIG. 12B. CNFG 50 will statically allocate space for the maximum number of these structures needed. Table 360 is accessed through the config_ptr 324 field of the configuration database 260.

| Field Name | Field Type | Comments |
|---|---|---|
| PCM_line (362) | UINT1 | High speed bus 25 used by this board. |

The resources provided by the telephony support modules 18 are further identified by LCIs according to an embodiment of the present invention. For instance, a LCI would be provided for a dial tone, which would be a resource provided by the one of the DSPs 226 (see FIG. 10). As before, this LCI identifies a timeslot 46 that exists on the high-speed bus 25 to which the telephony support module 18 is connected. In the embodiment of FIG. 2, the high speed bus 25 that is dedicated to the telephony-support modules 18 is bus 1. More than one of the traffic channels being switched by the switching platform 10 may need to be connected to a particular resource. For example, more than one of the traffic channels may need to hear a busy signal or ring signal at a particular time. Accordingly, the switch 43 is operable to connect the time slot carrying such signals to multiple traffic channels as instructed by the switching module controller 156.

Other resources provided by the telephony support module 18 include resources for decoding and transmitting signaling information that is used to form connections between information channels. The DSPs 226 of the telephony support module 18 will preferably provide a pool of such resources on various timeslots 46 of the high-speed bus 25 between the switch 43 and the telephony support module 18. These resources will be dynamically assigned, based on availability, to the traffic channels needing such resources.

When an interface module 10 registers with the switching module 16, the field 324 will be cast to field 372, as shown in FIG. 12B, and CNFG task 50 will update field 372, which is an array of spans (e.g., E1 s) contained in an interface module 20 (e.g., there are four spans on each module 20). Also, there will be a table 370 for each interface module 20. The span interface modules 20 preferably interface to E1-standard spans 40. An interface module 20 preferably contains 1 to 4 spans 40, with each span 40 being individually controllable.

| Field Name | Field Type | Comments |
|---|---|---|
| span[] (372) | CNFG_SPAN_TYPE | This field is an array 372 of CNFG_SPAN_TYPE, containing MAX_QSM_SPANS_BD (4) elements 420. |

The CNFG task 50 can support, for example, land spans 40 and GSM air spans 40. The content of each array field 372 is shown in table 420below and in FIG. 12B. As shown in the table 420, each span 40 has a unique logical identifier or "LCI" field 422, type field 424, state field 426, physical circuit array 428, and logical circuit array (air circuits only) 428. Defined types 424 comprise, for example: SPAN_NONE, SPAN_GSM_ABIS, or SPAN_PSTN. SPAN_NONE, indicates no physical connection to a interface module 20 for a particular span input. A span's state 426 may be ENABLED, DISABLED, or FAULTED. The state of a single span 40 does not affect other spans on the same board 40.

Air spans 40 (e.g., GSM_ABS) use both the logical and physical circuit arrays. Air span circuits map 4 to 1 within one of the timeslots of an exemplary high-speed bus 25. Thus, the logical circuit array 428 is preferably an array containing 128 entries 440. These logical LCI entries 440 are referenced by the Resource Manager. The physical circuit array 430 preferably contains 32 entries and is used for interface module 20 to DSP 242 mapping. This array 430 is used to translate LCI values from the Resource Manager to high-speed bus 25 and timeslot information. Land spans (e.g., PSTN spans) preferably map directly to physical circuits, in which case only the physical circuit array 430 is needed. These LCI entries are referenced by the Resource Manager. This array 430 is used to translate LCI values from the Resource Manager to high-speed bus 25 and timeslot 46 information.

| Field Name | Field Type | Comments |
|---|---|---|
| LCI (422) | UINT4 | LCI that identifies the particular span 40. |
| Type (424) | UINT1 | Span types:<br>SPAN_NONE<br>SPAN_PSTN<br>SPAN_GSM_ABIS |
| State (426) | UINT1 | ENABLED - span 40 is present at the interface module 20 and is ready for use.<br>DISABLED - span 40 is present, but disabled<br>FAULTED - span 40 is present, but faulted |
| Logigal_ckt [] (426) | CNFG_PHYS_CKT_TYPE | An array 426 of MAX_GSM_ENCODED_TIMESLOTS elements 440 representing the logical 4 to 1 mapping of air circuits. Not used for land circuits. |
| phys_ckt[] (428) | CNFG_PHYS_CKT_TYPE | An array 428 of MAX_2M_TIMESLOT elements 440 representing the physical timeslots for this span 40. |
| Dsp_lci[] (430) | UINT4 | An array 430 of MAX_2M_TIMESLOT elements 440, indicating the LCI of the DSP 442 "nailed" to this timeslot. Preferably, this field is only used for GSM spans. |

Still referring to FIG. 12B, tables 440 are used as the lowest level in the configuration database 52 and provide the pcm bus values. For example, each table 440 provides the high-speed bus 25 and timeslot a specified circuit is mapped to.

| Field Name | Field Type | Comments |
|---|---|---|
| Line (442) | UINT1 | High-speed bus 25 number, preferred range is 0–15. |
| Slot (444) | UINT1 | Timeslot number within a particular high-speed bus 25, preferred range is 0–127. |
| Type (446) | UINT1 | circuit type |

FIG. 13 is an exemplary flow chart describing how LCIs according to an embodiment of the present invention are used to configure communications within the telecommunications switching platform 10. The process begins at step 460, where, for example, the resource manager provides a LCI to the SWTH task which in turn calls the Cnfg_Lci_XIation process of the CNFG task 50. At step 462, the switching module 16 uses the LCI to extract the slot, span, and board_type that is associated with the LCI, for example, using the GET macro described previously.

At decision step 464, if the slot provided within the LCI exceeds the maximum number of slots in the backplane of the telecommunications switching platform, then the switching module 16 would note that this is an invalid slot and would return that result at step 466 (INVALID SLOT). If, however, the slot number was in the permissible range for of a particular telecommunications switching platform, the switching module 16 at step 468 compares the provided board_type from the LCI to the table of board_types that are in use in that particular telecommunications switching platform. If the board_type provided in the LCI is not a board_type used in the particular telecommunications switching platform 10, the process at step 470 returns that result from the process (INVALID BOARD).

Now, if the board_type was one of the permissible types of boards for that particular telecommunications switching platform, the process proceeds to follow different paths depending on which type of board was identified by the particular LCI. At step 472, if the board_type corresponds with that for a telephony support module 18 (sometimes referred to as a PCM-Support Module or "PSM"), then the process will continue at step 474. If, on the other hand, the board_type corresponds to an interface module 20, the process at step 480 will proceed to step 500, which is identified by the "A" branch (see FIG. 13B). If the board_type is neither the telephony support module 18 or an interface module 20, the process proceeds to step 482, where the board_type is checked to see whether it corresponds with a switching module 16. If the board_type indicates a switching module 16, the process continues to step 550, which is designated by "B," which is shown again at the top of FIG. 13C. If the board_type is neither a telephony support module 18, nor an interface module 20, nor a switching module 16, then the process continues to step 484, where it is determined whether the board_type corresponds to that associated with signal processing module 22. If the board_type does corresponds to a signal processing module 22, the process continues to step 600, which is identified by "C" and is shown again at the top of FIG. 13D. Since the board_type was tested for validity at step 468, the board_type should always be able to be identified by one of the decision blocks 472, 480, 482, 484, or a new decision block for a new type of board not specifically described herein. Step 486 is nonetheless provided as a default to return an INVALID BOARD message if for whatever reason the process proceeds from all the known board_type decision blocks without branching to the handler for that particular type of board type.

Returning to the manner in which LCIs are handled for each of the particular board_types, if the board_type was that of a telephony support module 18, the process continues at step 474. At step 474, the switching module 16, using the LCI, extracts the circuit identifier, for example using a GET macro. At step 476, the switching module 16 looks to the configuration table 52 to find the telephony support module's assigned high speed bus 25 (sometimes referred to as a PCM-line). At step 478, the process returns a high speed bus 25 identifier and the particular slots used by the telephony support module 18. For example, the circuit identifier extracted from the LCI would be used as an index into database 260 illustrated in FIG. 12A to navigate through to the database table 360, which identifies the PCM line used by the module 18.

If the board_type was that of an interface module 20, the process continues at step 500 (FIG. 13B). At step 502, the span identifier within the LCI is extracted and tested to see if it is within the range of 0–3. This is because in the embodiment of the present invention, the interface module 20 handles no more than four spans by itself. If the span identifier is outside this permissible range, the process returns an INVALID SPAN message at step 504. If, on the other hand, the span identifier is within the permissible range, the process creates a pointer to a data set that associated with the particular span, and extracts the span_type that is associated with this particular span 40 from the data structure at step 506. At decision blocks 508 and 510 it is determined from the span_type information within the configuration table 52 whether the particular span 40 is a land-based span or an air span. For example, table 420 for each interface module 20 includes span type information in field 424. Land-based spans are sometimes specifically referred to as PSTN spans and air spans are sometimes specifically referred to as GSM or PCS spans. If at step 508 it is determined that the span is a land-based span, the process sets the circuit-pointer to point to the physical circuit array in the configuration table at step 514 (see field 430 of table 420 in FIG. 12B). If at step 508 it was determined that the span was not a land-based span, the process would continue to step 510, where the span_type would be tested to see whether the span is a GSM-ABIS air span. In the present configuration, if the span was neither of these types, the process returns an INVALID SPAN message at step 512. If, on the other hand, it was determined at step 510 that the circuit was an air span, then at step 511 it would be determined if a force physical bit in the span LCI was set. If the force physical bit was set, the ckt_ptr would be set to the physical circuit in step 513 because this would indicate that the nailed up connection for the span was not yet established and the physical circuit associated with the span should be used to establish the nailed up connection between the span and its allocated DSP. If the force physical bit is not set, then at step 518 the process sets a pointer to the logical circuit in the configuration table 52 for the desired traffic channel. Once the pointer has been properly set at step 513, 514 or step 518, the process continues at step 516 to extract the circuit identification from the LCI. If the circuit is within a permissible range for circuits within that particular telecommunications switching platform (step 518), the process returns that circuit's line and slot information at step 522. If the circuit is outside the range of permissible circuits, the process returns an INVALID CIRCUIT message at step 520.

Figure 13C:
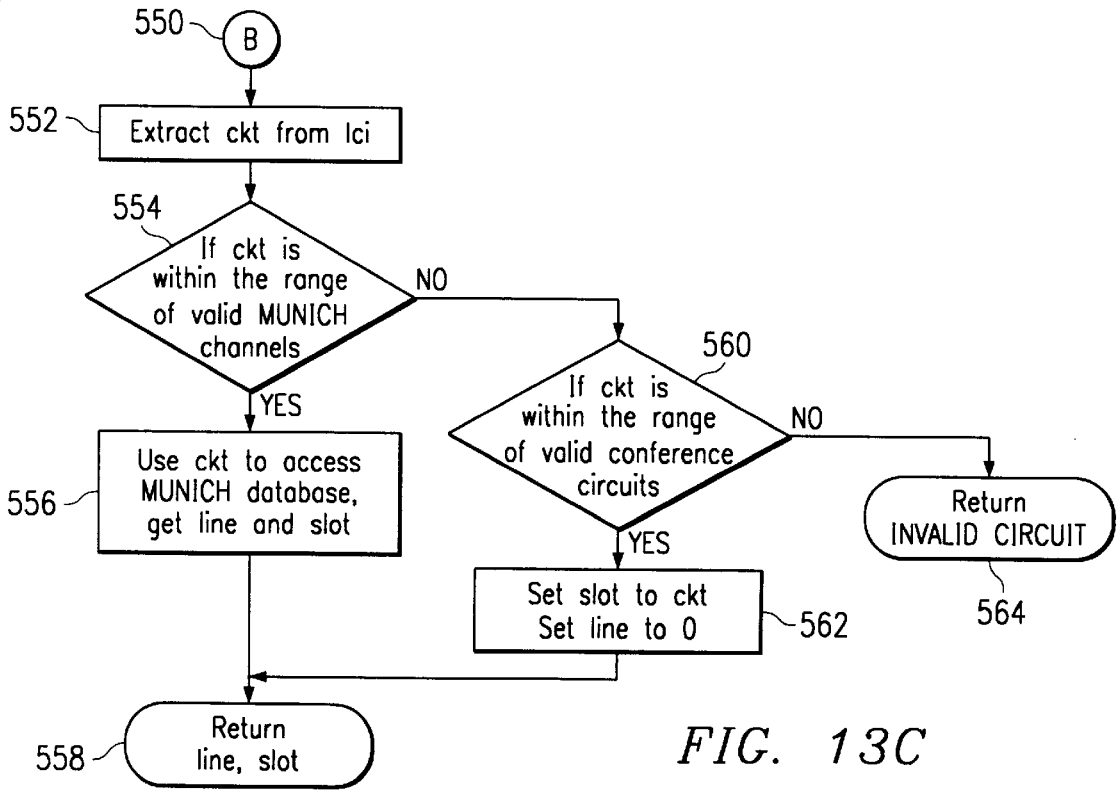

If the board_type corresponds with that for the switching module 16, the process continues at step 550 (FIG. 13C). Here, switching module 16 extracts the circuit identification from the LCIs at step 552. If the circuit identification is within the range of valid control channels, which are sometimes referred to as MUNICH32 channels, the process will access at step 556 the configuration table 52 to get to the line and slot information associated with that particular circuit. For example, the switching module 16 LCI would be used to index through database 260 to table 330 down to the line and slot fields for the circuit contained in table 440, as shown in FIG. 12B. If, on the other hand, the circuit is outside the range of valid MUNICH32 channels, then at step 560 the circuit is checked to see whether it is within the range of valid conference circuits. If it is, at step 562, the slot is set to "circuit" and the line is set to 0. This line and slot information will be returned from the process at step 558. If the circuit was outside the range of valid MUNICH channels and valid conference circuits, in this embodiment the process returns an INVALID CIRCUIT message at step 564.

Figure 13D:
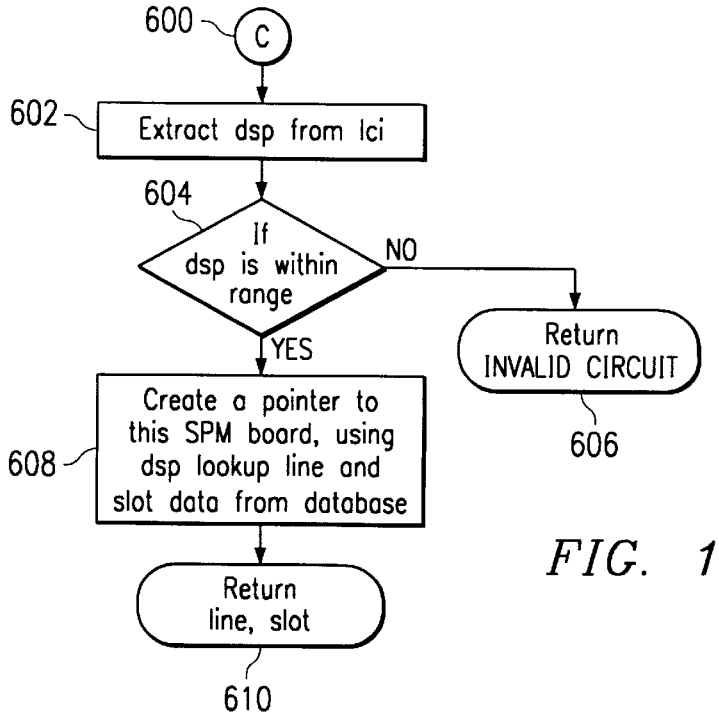

If the board_type corresponds with that for a signal processing module 22, which is sometimes referred to as an SPM, the process continues at step 600 (see FIG. 13D). At step 602, the DSP information is extracted from the LCI. If at step 604 it is determined that the DSP is within the range of permissible DSPs for the switching platform, (e.g., numbered between 1 and 8) the process at step 608 creates a pointer to this SPM board using the DSP look-up line and slot data from the configuration table 52. This line and slot information is return from the process at step 610. If at step 604 the DSP had been outside the range of permissible DSP use, the process will returned an INVALID CIRCUIT message at step 606.

According to an embodiment of the present invention, the interaction of LCIs, the CNFG task 50 and the CNFG database 52 is now described. When an air traffic channel is added (e.g., in response to an ADD_TCH message to make a nailed up connection), the call processor 12 provides a span LCI and a physical timeslot to be used for the connection. From this information, a logical timeslot can be determined. For example, if the call processor 12 sends a command, for example via a resource messenger to the switching module 16, to add a traffic channel to timeslot 1, a span LCI is provided (which provides the shelf, slot, board type, span (air or land) and a span number) and a physical timeslot, e.g., 1. With this information, CNFG task 50 locates a free DSP for the nailed up connection by going into the CNFG tables, illustrated in FIGS. 12A and 12B and reading field 346 to find a free DSP. For example, CNFG task 50 searches the configuration database 52 for all signal processing modules 16 by traversing the board array field 278 and reading field 304 for each board to determine its type. For each signal processing module identified, the CNFG task 50 reads field 346 to determine if a free DSP exists. If field 346 indicates that a free DSP exists, the CNFG task 50 would search array field 350 for each DSP on the signal processing module 16, reading field 404 for each DSP to determine if the DSP is free until the free DSP is located. The DSP array 350 for the free DSP also includes fields 402–410 as shown in FIG. 12B.

Field 408 identifies the encoded GSM connection of the DSP, e.g., the pcm bus line and slot contained in fields 442–446 as shown in FIG. 12B, for the nailed up connection. Field 410 includes an array of the decoded GSM connections of the DSP namely the pcm line and slot for each connection of the free DSP that provides a DSO for a single voice connection. Thus, the line and slot for the encoded GSM connection for the free DSP provides one connection point on the swiching module 16, the other connection point being the LCI of the span provided by the call processor 12. Accordingly, a nailed up connection is made between these points.

Figure 14:
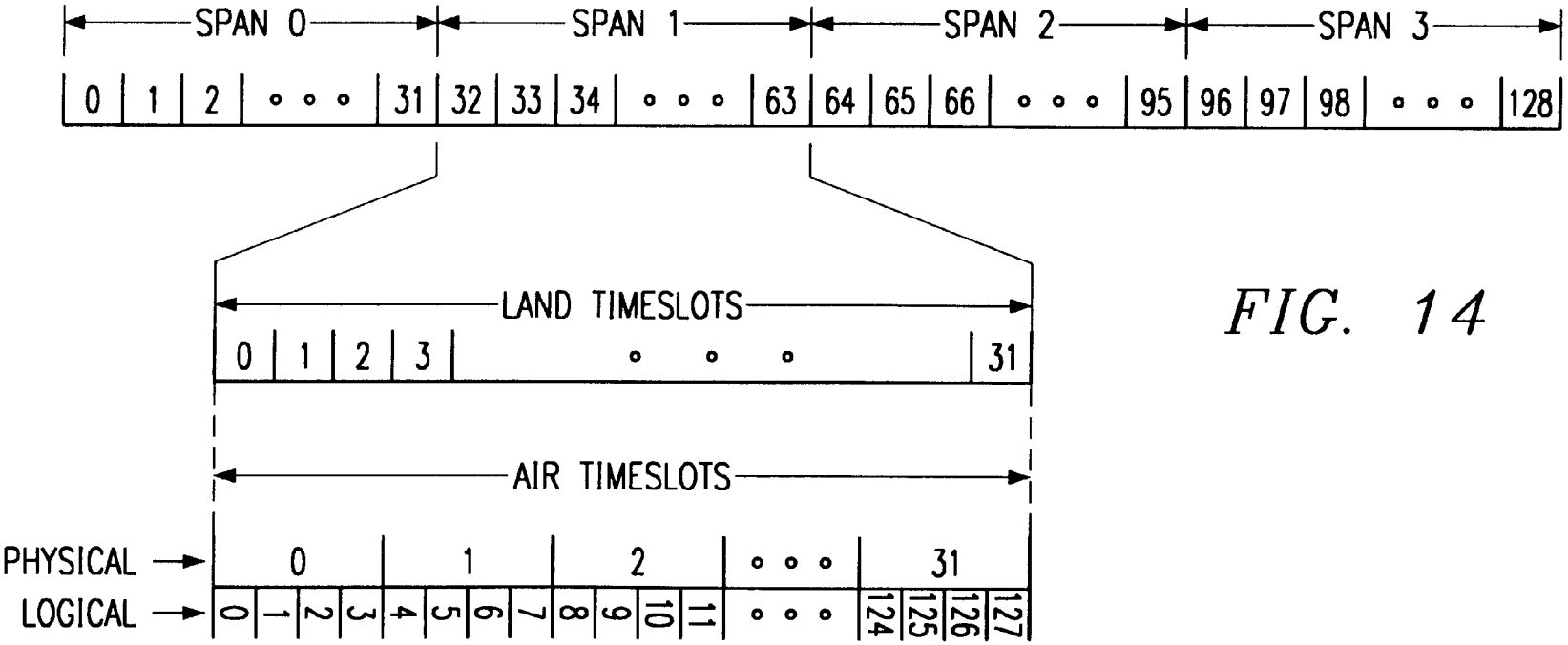
FIG. 14 illustrates timeslot assignments on an exemplary span according to an embodiment of the present invention.

As shown in FIG. 12B, the LCI of the span for the nailed up connection to the free DSP is inserted into field 406 (which is in table 400 for the free DSP now assigned to the nailed up connection) and represents the span and physical timeslot the DSP is connected to. Similarly, the span array 372 contains fields 422–432 for each span. Field 432 contains the LCI of the free DSP now being used for the nailed up connection to the span. Field 430 in the span array 372 represents the physical timeslot used for the nailed up connection that is connected via the switching module 16 to the physical circuit identified in field 408 of the DSP table 400 thus providing the nailed up connection. If the nailed up connection is for a land span, then field 430 provides the physical timeslot used to process a call through the switching platform 10. However, if the nailed up connection is for an air span, indicated in field 424, then for call processing on the span, the physical timeslot field 430 is used only for establishing the nailed up connection and actual call processing (e.g., the voice connection for a call) uses the logical timeslot field 428. With reference to FIG. 14, each interface module 20 can support four spans, each span providing 32 physical timeslots (e.g., DSOs) numbered 0–31. An exploded view of span 1 in FIG. 14 illustrates the 32 physical timeslots on the span, which could be used, on a land span, to support a 32 traffic channels. However, if the span is an air span, then each physical timeslot, which is a 64kbps DSO, can support 4 16kbps GSM traffic channels and thus there are 128 logical timeslots for each span (each of the 32 physical timeslots support 4 GSM channels), the logical timeslots being numbered 0–127 as shown in FIG. 14. Accordingly, a logical timeslot is determined by the span and physical timeslot. For example, on span 1, physical timeslot 1, logical timeslots 4, 5, 6 and 7 are available and can be addressed via the logical circuit array 428, each logical circuit being assigned a pcm line and slot in fields 442–446 as shown in FIG. 12B The tables 440 including fields 442–446 contain the pcm bus values and are based, for example, on the hardware layout information stored in a table in the switching module 16 that associates the pcm line and slot data with the component assigned to the timeslot. Fields 442–446 are initially set to a null value for the logical timeslots until air traffic channels are added, which are added four at a time. When the air channels are added, the line and slot for each logical circuit stored in array field 428 will correspond to the four decoded GSM connections for the associated DSP stored in array field 410 of DSP table 400 for the particular DSP.

Once a nailed up connection is established, the nailed up DSP LCI from dsp_lci field 402 goes in the dsp_lci array field 432 for the span of the nailed up connection (e.g., each timeslot on a span could be a traffic channel assigned a unique DSP). Similarly, the LCI of the span of the nailed up connection is put in field 406 of the DSP table 400, as shown in FIG. 12B.

If a DSP is to be reallocated because, for example, the DSP has failed (e.g., the board detects that a DSP is not responding to a polling signal), the board containing the DSP has been removed from the system or a test such as built in test (BIT) determines that the DSP is bad, then the DSP can be replaced by an operational DSP via a remapping operation according to an embodiment of the present invention. The remapping can be done as long as there is an available DSP to assume the functions of the failed or missing DSP. For example, to remap a DSP (or any other component that may have spare components available) according to an embodiment of the present invention, the resource manager and thus the call processor 12, is told by, for example, the CNFG task 50 that a particular DSP is out of service. As explained earlier, the LCI of the span connected to the bad DSP to can be provided to the resource manager by CNFG task 50. This LCI would include the span and the physical timeslot used for the nailed up connection, which identifes the GSM encoded connection to the DSP (e.g., the physical circuit identified in field 408 of table 400 for the DSP) from which the four traffic channels (e.g., the decoded GSM connections of the DSP identified in array field 410 in table 400 for the DSP) can be identified. With this information, the resource manager informs the call processor 12 that the four traffic channels allocated to the failed DSP are out of service. Once the traffic channels are out of service, the switching module 16 will attempt to locate a free DSP. For example, the CNFG task 50 will read field 346 of the DSP table 340 to determine if there is a free DSP and then determine the LCI of the free DSP as explained previously. If a free DSP cannot be located, no further action is taken to remap the connections to the failed DSP and the affected traffic channels remain out of service.

However, if a free DSP is located, a move traffic channel (MOVE TCH) message is sent to the SWTH task which, for example, takes the LCI of the span connected to the bad DSP, the LCI of the bad DSP and the LCI of the new DSP and moves the connection in the switching module 16 of the affected span to the new DSP and will then break the connection between the affected span and the bad DSP. Once the new connection is established, the resource manager is then told that the affected traffic channels are now available, the resource manager informing the call processor 12 that the traffic channels are back in service. The MOVE TCH message involves, for example, the following changes to the CNFG database 52 illustrated in FIGS. 12A and 12B. The qsm_trunk_lci field 406 in the DSP table 400 for the new DSP will be updated to contain the LCI of the span (e.g., the span does not change and the LCI of the span is put in the database for the remapped DSP). Correspondingly the dsp_ lci[] field 432 in the span table 420 for the span will be updated with the LCI of the new DSP. In addition, as a new DSP has been mapped to the span, the new LCIs for the physical circuit connection to the new DSP and the logical circuits (e.g., four for every physical circuit) must be provided to the configuration database 52 for the span. Accordingly, the decoded DSP pcm line and slot data for the new DSP of field 410, contained in fields 442–446 of field 440 of the new DSP will be copied into the logical_ckt array 428 of the affected span, e.g., the four traffic channels associated with the four logical circuits in the affected span will be replaced with the circuits of the new DSP that will handle the traffic channels.

Therefore, the failed DSP has been dynamically remapped to allow a new DSP to assume the functions of the failed DSP and further, all of the changed connections remained transparent to the call processor 12. For example, the LCIs of the spans were not changed nor were the traffic channels assigned to each span and thus no additional processing was required by the call processor 12 due to the remapping process. Utilizing a configuration database 52 according to embodiments of the present invention, for example as illustrated in FIGS. 12A and 12B, allows for dynamic reallocation of resources. For example, if an interface module 20 was removed from the switching platform 10, using the same process as described above, the DSPs associated with the affected traffic channels (which are not affected by the removal of the interface board 20) can be readily identified and returned to the free pool to provide additional available DSP resources to the switching platform 10.

A few preferred embodiments have been described in detail hereinabove. It is to be understood that the scope of the invention also comprehends embodiments different from those described, yet within the scope of the claims. For example, the terms "controller," "processing circuitry," and "control circuitry" comprehend ASICs (application specific integrated circuits), PAL (programmable array logic), PLAs (programmable logic arrays), decoders, memories, non-software based processors, or other circuitry, or digital computers including microprocessors and microcomputers of any architecture, or combinations thereof. Memory devices include SRAM (static random access memory), DRAM (dynamic random access memory), pseudo-static RAM, latches, EEPROM (electrically-erasable programmable read-only memory), EPROM (erasable programmable read-only memory), registers, or other memory devices known in the art. Words of inclusion are to be interpreted as nonexhaustive in considering the scope of the invention.

Aspects of the claimed invention may be applied to switching systems for GSM mobile switches, PCS mobile switches, or in switches primarily used for switching land-based circuits. The telecommunications circuits described in the preferred embodiment were generally E1 or T1 spans, but aspects of the invention could be applied to platforms that switch lower- or higher-bandwidth circuits such as T-2, T-3, or SONET. Also, aspects of the invention could be applied to switch circuits of bandwidths generally equivalent to E1 or T1 but having different framing formats.

Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for remapping a component in a switching platform, comprising the steps of:

identifying a failed component;

searching a configuration database to determine if a replacement component is available;

if a replacement component is available, making a new connection in the switching platform including the replacement component; and dynamically updating the configuration database to reflect the new connection including the replacement component.

2. The method according to claim 1, wherein the failed component includes a digital signal processor (DSP) and the replacement component includes a spare DSP.

3. The method according to claim 1, wherein the configuration database includes configuration data for each resource in the switching platform.

4. The method according to claim 3, wherein the resource includes one of a switching module, a signal processing module, an interface module and a telephony support module.

5. The method according to claim 3, wherein each resource in the switching platform is identified by a logical component identifier (LCI), the LCI also providing an index into the configuration database.

* * * * *